(12) United States Patent
Yamamoto et al.

(10) Patent No.: US 7,580,240 B2
(45) Date of Patent: Aug. 25, 2009

(54) VIA ARRAY CAPACITOR, WIRING BOARD INCORPORATING A VIA ARRAY CAPACITOR, AND METHOD OF MANUFACTURING THE SAME

(75) Inventors: Hiroshi Yamamoto, Konan (JP); Toshitake Seki, Niwa-gun (JP); Jun Otsuka, Konan (JP); Manabu Sato, Nagoya (JP); Masahiko Okuyama, Nagoya (JP)

(73) Assignee: NGK Spark Plug Co., Ltd., Aichi (JP)

( * ) Notice: Subject to any disclaimer, the term of this patent is extended or adjusted under 35 U.S.C. 154(b) by 366 days.

(21) Appl. No.: 11/603,161

(22) Filed: Nov. 22, 2006

(65) Prior Publication Data
US 2007/0117338 A1  May 24, 2007

(30) Foreign Application Priority Data
Nov. 24, 2005  (JP)  ............................ P2005-337969
Feb. 9, 2006  (JP)  ............................ P2006-032984
Oct. 16, 2006  (JP)  ............................ P2006-281379

(51) Int. Cl.
*H01G 4/06* (2006.01)
*H01G 4/228* (2006.01)

(52) U.S. Cl. ..................................... 361/311; 361/306.1

(58) Field of Classification Search .............. 361/306.1, 361/307, 311, 303
See application file for complete search history.

(56) References Cited

U.S. PATENT DOCUMENTS

| 6,905,936 | B2* | 6/2005 | Murakami et al. | .......... 438/381 |
| 7,002,075 | B2 | 2/2006 | Kambe et al. | |
| 2005/0207091 | A1 | 9/2005 | Kambe et al. | |
| 2007/0035013 | A1* | 2/2007 | Handa et al. | ................. 257/717 |

FOREIGN PATENT DOCUMENTS

JP  2004-228190  8/2004
JP  2005-39243  2/2005

* cited by examiner

*Primary Examiner*—Eric Thomas
(74) *Attorney, Agent, or Firm*—Sughrue Mion, PLLC

(57) ABSTRACT

A via array capacitor including a capacitor body having a first main surface and a second main surface and having a structure in which dielectric layers and inner electrode layers are alternately laminated; a plurality of via conductors which conduct the inner electrode layers to each other and are, as a whole, arranged in array form; and metal-containing layers which are disposed on at least one of the first main surface and the second main surface, wherein a total volume of the inner electrode layers and the metal-containing layers included in the via array capacitor is from 45 vol.% to 95 vol.% of a volume of the via array capacitor.

5 Claims, 13 Drawing Sheets

VIA ARRAY CAPACITOR, WIRING BOARD INCORPORATING A VIA ARRAY CAPACITOR, AND METHOD OF MANUFACTURING THE SAME

FIELD OF THE INVENTION

The present invention relates to a via array capacitor which is incorporated in a laminated portion of a wiring board, a wiring board incorporating a via array capacitor having a via array capacitor, and a method of manufacturing the same.

BACKGROUND OF THE INVENTION

Semiconductor devices (IC chips) used in CPUs of computers in recent years tend to be characterized by increasingly higher speed and higher functions, and the number of terminals tends to increase and the pitch between the terminals tends to become narrower correspondingly. Generally, a multiplicity of terminals are densely arranged in array form on the bottom surface of the IC chip, and such terminal groups are connected to terminal groups on the motherboard side in flip chip form. However, since there is a large difference in the terminal pitch between the terminal groups on the IC chip side and the terminal groups on the motherboard side, it is difficult to directly connect the IC chip onto the motherboard. For this reason, a technique is generally adopted in which the IC chip is mounted on a wiring board for IC chip mounting, and the wiring board for IC chip mounting is mounted on the motherboard. As the wiring board for IC chip mounting of this type, those have hitherto been proposed in which a capacitor is embedded in a core board formed of a polymeric material to form a core portion, and buildup layers are respectively formed on the obverse surface and the reverse surface (e.g., refer to JP-A-2005-39243). In addition, a wiring board for IC chip mounting in which a capacitor is incorporated in an insulating layer of the wiring board has also been hitherto been proposed (e.g., refer to JP-A-2004-228190).

To attain the stabilization of a power source due to the low inductance between the capacitor and the IC chip, it is preferable to make the distance between the capacitor and the IC chip as short as possible. Accordingly, it is conceivable to incorporate the capacitor in a buildup layer which is closer to the IC chip than the core board.

SUMMARY OF THE INVENTION

However, in a case where the above-described capacitor is the so-called capacitor of a via array type (via array capacitor), it is necessary to make the via array capacitor thin in order to incorporate it in a buildup layer which is far thinner than the core board (normally 0.8 mm or thereabouts) having a large thickness. This via array capacitor is likely to be fractured or broken during handling since its thickness is thin although it has a larger area than a chip type capacitor. In addition, a problem can possibly occur in that a crack is formed in the via array capacitor in the step of its incorporation into the buildup layer. Further, even if a crack does not occur in the incorporating step, the reliability of the wiring board can also possibly decline due to the incorporation of the via array capacitor having a thin thickness although it has a larger area than the chip type capacitor.

The invention has been devised in view of the above-described problems, and its object is to provide a via array capacitor which, even if the thickness is made thin, is able to prevent breakage by improving its flexibility. Another object of the invention is to provide a wiring board incorporating a via array capacitor capable of attaining improvement of the low height and reliability by incorporating the aforementioned via array capacitor, as well as a method of manufacturing the same.

To attain the above objects, in accordance with a first aspect of the invention there is provided a via array capacitor for incorporation in a wiring board, comprising: a capacitor body including a first main surface and a second main surface and having a structure in which dielectric layers and inner electrode layers are alternately laminated; a plurality of via conductors which conduct the inner electrode layers to each other and are, as a whole, arranged in array form; and metal-containing layers which are disposed on at least one of the first main surface and the second main surface, wherein a total of the thickness of the metal-containing layers disposed on the first main surface and the thickness of the metal-containing layers disposed on the second main surface is not less than 15% and not more than 80% of the overall thickness of the via array capacitor.

Therefore, according to the via array capacitor in accordance with the above-described first aspect, by setting the total thickness of the metal-containing layers to not less than 15% and not more than 80% of the overall thickness of the via array capacitor, the proportion of the metal portions becomes high for the via array capacitor as a whole. As a result, the overall via array capacitor is reinforced by the metal portions, the flexibility improves, and its own strength improves, so that it is possible to prevent the breakage of the via array capacitor even in cases where the overall thickness of the via array capacitor is made thin.

If the total thickness of the metal-containing layers is less than 15% of the overall thickness of the via array capacitor, the effect of improvement of the above-described strength (flexibility) derived from the thickness of the metal-containing layers becomes small. On the other hand, if this total thickness exceeds 80%, the capacitor body becomes thin relative to the entire via array capacitor, and the fabrication of the capacitor body becomes difficult; therefore, there is a possibility that the via array capacitor fails to exhibit its function as the capacitor. In addition, since the capacitor body becomes thin, the numbers of dielectric layers and inner electrode layers making up the capacitor body decrease, so that the capacity of the capacitor declines. It should be noted that the total thickness of the metal-containing layers is more preferably not less than 25% and not more than 70% of the overall thickness of the via array capacitor, even more preferably not less than 35% and not more than 60%. Here, the phrase "the overall thickness of the via array capacitor" refers to the thickness in which the thickness of the capacitor body is added to the total of the thickness of the metal-containing layers disposed on the first main surface and the thickness of the metal-containing layers disposed on the second main surface. The overall thickness of the via array capacitor is preferably not less than 10 μm and not more than 200 μm. If the overall thickness of the via array capacitor is less than 10 μm, the formation of the via array capacitor becomes difficult. On the other hand, if the overall thickness of the via array capacitor is more than 200 μm, it becomes difficult to incorporate the via array capacitor into the laminated portion.

The capacitor body for constituting the above-described via array capacitor has a plate-like shape and has a structure in which the dielectric layers and the inner electrode layers are alternately laminated. As the dielectric layer, it is possible to cite a ceramic dielectric layer, a resin dielectric layer, a dielectric layer formed of a ceramic-resin composite material, and the like. As the ceramic dielectric layer, dielectric ceramics, such as barium titanate, lead titanate, and strontium titanate, are suitably used. If the dielectric ceramic is used, a via array capacitor having a large electrostatic capacity is easily realizable. In addition, low-temperature co-fired ceramics, such as borosilicate glass and a glass ceramic in which an inorganic ceramic filler such as alumina is added to borosilicate glass, are suitably used. Further, high-temperature co-fired ceramics, such as alumina, aluminum nitride, boron nitride, silicon carbide, and silicon nitride, are used depending on the required characteristics. In addition, as the resin dielectric layer, a resin such as epoxy resin and polytetrafluoroethylene (PTFE) containing an adhesive is suitably used. In addition, as the dielectric layer consisting of the ceramic-resin composite material, barium titanate, lead titanate, and strontium titanate are suitably used as the ceramic, while, as the resin material, it is possible to suitably use thermosetting resins such as epoxy resin, phenol, urethane, silicone, polyimide, and unsaturated polyester, thermoplastic resins such as polycarbonate, acryl, polyacetal, and polypropylene, and latexes such as nitrile-butadiene rubber, styrene-butadiene rubber, and fluoro rubber.

The materials for forming the inner electrode layers and the via conductors are not particularly limited, but in a case where a sintered body of a ceramic whose firing temperature is high is selected, it is preferable to use a metal which can be sintered simultaneously with that ceramic, e.g., nickel, molybdenum, tungsten, titanium, and the like. It should be noted that in a case where a sintered body of a low-temperature co-fired ceramic which can be fired at 1000° C. or below is selected, the use of such as copper and silver becomes possible. Meanwhile, in a case where the dielectric layer is the resin dielectric layer, or the dielectric layer is a dielectric layer consisting of the ceramic-resin composite material, the dielectric layer is not sintered. Therefore, the inner electrode layers are formed in the capacitor body not by firing but by plating or bonding. The inner electrode layers are formed by using a metal such as nickel, copper, cobalt, and covar, or an alloy thereof, or by using nickel-boron (Ni—B) plating, nickel-phosphorus (Ni—P) plating, or the like.

It should be noted that the aforementioned capacitor body preferably has a substantially rectangular shape in a plan view with four sides, and recessed portions and projecting portions are preferably arranged alternately and regularly at the four sides along the direction in which the side extends. If the construction is thus provided, in a case where the via array capacitor is incorporated into the laminated portion by being caused to sink into the interlayer insulating layers in an uncured state, the via array capacitor is prevented from becoming positionally offset in the planar direction since the recessed portions and the projecting portions formed at each side of the capacitor body serves as resistance. Hence, the positioning accuracy improves. In addition, the corners of the via array capacitor should preferably be chamfered. By so doing, the breakage of the corners can be prevented since the stress applied to the corners of the via array capacitor is alleviated. In addition, when a thermal stress is applied to the wiring board incorporating a via array capacitor; it is possible to prevent the occurrence of a crack due to the difference in thermal expansion between the via array capacitor and the interlayer insulating layers for constituting the laminated portion. As for the shape of chamfering, it is possible to apply a known working method such as C chamfering or R chamfering. It is possible to prevent the occurrence of breakage due to the mutual contact of the products in the manufacturing process.

Metal-containing layers which mainly consist of metal are provided on at least one of the first main surface and the second main surface of the capacitor body. It should be noted that in a case where a plurality of terminal electrodes which are connected to end faces of via conductors are present on the main surface, these terminal electrodes are included among the metal-containing layers. In a case where the dielectric layers are the ceramic dielectric layers, the metal-containing layers are formed by using a metallic material such as nickel, molybdenum, tungsten, titanium, copper, silver, or the like, which is suitable for metallization since the material can be sintered simultaneously with the ceramic. As the metal-containing layers, pure metal layers can be used, but it is preferable to use metal layers containing a glass component, or composite metal layers containing as a common material (filler) a ceramic constituting the ceramic dielectric layer. By so doing, adjustment can be made to adjust the firing behavior at the time of co-firing, the difference in the coefficient of thermal expansion can be alleviated and adjusted when a thermal shock is received, and adhesiveness can be imparted, so that the metal-containing layer can be reliably adhered to the ceramic dielectric layer. Meanwhile, in a case where the dielectric layer is the resin dielectric layer, or the dielectric layer is a dielectric layer consisting of the ceramic-resin composite material, the dielectric layer is not sintered. Therefore, the metal-containing layers are formed in the capacitor body not by firing but by plating or bonding. The metal-containing layers are formed by using a metal such as nickel, copper, cobalt, and covar, or an alloy thereof, or by using nickel-boron (Ni—B) plating, nickel-phosphorus (Ni—P) plating, or the like.

The thickness of the metal-containing layers is set in accordance with the overall thickness of the via array capacitor. For example, in a case where the overall thickness of the via array capacitor is not less than 10 µm and not more than 200 µm, the thickness of the metal-containing layers disposed on at least one of the first main surface and the second main surface should preferably be not less than 3 µm and not more than 50 µm. If the thickness of the metal-containing layers is less than 3 µm, the flexibility of the entire via array capacitor cannot be improved sufficiently. On the other hand, if the thickness of the metal-containing layers is greater than 50 µm, the entire via array capacitor undesirably becomes excessively large. In addition, the metal-containing layers disposed on the first main surface and the metal-containing layers disposed on the second main surface should preferably be set to the same thickness. By so doing, it is possible to reduce the irregularities, warpage, and waviness of the via array capacitor after firing As a result, the flatness (coplanarity) of the mounting-side obverse surface of the laminated portion incorporating the via array capacitor improves, thereby improving the mounting reliability after the installation of the semiconductor device. It should be noted that in a case where the metal-containing layers include a plurality of terminal electrodes, a clearance of a predetermined amount should preferably be provided between adjacent ones of the terminal electrodes.

Surfaces of the metal-containing layers should preferably be coarser than the first main surface and the second main surface of the capacitor body. Namely, the reason is that if the construction of the invention is adopted, the proportion of coarse surfaces provided on the via array capacitor side at the bonding interface with the interlayer insulating layer becomes large, making it possible to improve the adhesive strength with respect to the interlayer insulating layer as compared with conventional cases by virtue of the so-called anchor effect. As a method of coarsening the surfaces of the metal-containing layers, it is possible to use known coarsening means including coarsening by chemical etching, coarsening by physical etching, and coarsening by heat treatment during such as firing or annealing. Since the via array capacitor in accordance with the invention incorporates in the laminated layer thinner buildup layers and the like than conventional core boards, chemical etching which makes fine etching possible.

In addition, an occupying area of the metal-containing layers which are present on the first main surface should preferably be not less than 45% and not more than 90% of an area of the first main surface, and an occupying area of the metal-containing layers which are present oh the second main surface should preferably be not less than 45% and not more than 90% of an area of the second main surface. By so doing, since the proportion of the metal portions becomes reliably high for the via array capacitor as a whole, the overall via array capacitor is reinforced by the metal portions, the flexibility improves, and its own strength also improves. In addition, as a result of the fact that the occupying area of the metal-containing layers is set to not less than 45% and not more than 90% of the area of the first main surface (or the second main surface), the proportion of the metal portions at the bonding interface with the interlayer insulating layer for constituting the laminated portion becomes large, making it possible to improve the adhesive strength with respect to the interlayer insulating layer. If the occupying area is less than 45%, since the proportion of the metal-containing layers at the bonding interface does not become very large, the adhesive strength cannot be improved sufficiently. On the other hand, if the occupying area is greater than 90%, in a case where the metal-containing layers include a plurality of terminal electrodes which are connected to end faces of the via conductors, the clearance between adjacent ones of the terminal electrodes becomes excessively small, so that the possibility of a short-circuiting between adjacent ones of the terminal electrodes becomes high. In addition, since the occurrence of irregularities, warpage, and waviness of the via array capacitor is suppressed, the flatness (so-called coplanarity) of the mounting-side obverse surface of the laminated portion incorporating the via array capacitor improves, thereby improving the mounting reliability after the installation of the semiconductor device.

The metal-containing layers should preferably include a plurality of terminal electrodes which are connected to end faces of the via conductors on at least one of the first main surface and the second main surface, as well as dummy electrodes which are disposed in a region where the plurality of terminal electrodes are not present on at least one of the first main surface and the second main surface and which do not conduct with the via conductors. If the construction is thus provided, as a result of the fact that, in addition to the plurality of terminal electrodes, dummy electrodes are provided on at least one of the first main surface and the second main surface, the proportion of the metal-containing layers at the bonding interface with the interlayer insulating layer for constituting the laminated portion becomes large, making it possible to improve the adhesive strength with respect to the interlayer insulating layer. In addition, since the occurrence of irregularities, warpage, and waviness in at least one of the first main surface and the second main surface can be suppressed, the flatness (so-called coplanarity) of the mounting-side obverse surface of the laminated portion incorporating the via array capacitor improves, thereby improving the mounting reliability after the installation of the semiconductor device.

In addition, the outer shape of each of the plurality of terminal electrodes, when viewed from the direction of the first main surface or the direction of the second main direction may be any one of a substantially rectangular shape, a substantially circular shape, and a substantially triangular shape. In the case of the substantially rectangular shape, the clearance between the terminal electrodes becomes small, so that the occupying area of the plurality of terminal electrodes can be easily made large relative to the first main surface or the second main surface. Hence, the proportion of the metal portions at the bonding interface with the interlayer insulating layer for constituting the laminated portion becomes even greater, thereby further improving the adhesive strength with respect to the interlayer insulating layer.

A metal layer formed of a metal which is softer than the metal constituting the metal-containing layer should preferably be formed on the surface of the metal-containing layer. The reason is as follows. For example, in a case where the metal-containing layer is a sintered metal layer, the metal-containing layer is relatively hard, so that it is extremely difficult to directly coarsen its surface by using an etchant or the like. Accordingly, if a soft metal layer is formed, and the surface of the layer is coarsened, a desired coarse surface can be obtained relatively easily and reliably. It should be noted that, as a technique for forming a soft metal layer, a plating method using electrolytic plating, electroless plating, or the like is suitable for reasons of ease and low cost. However, it is also possible to adopt a technique other than the plating method, such as sputtering, CVD, and vacuum deposition.

In this case, the material of the metal layers is appropriately selected depending on the kind of metal-containing layers, but in a case where the metal-containing layers are formed of, for example, nickel, it is suitable to select copper layers (copper plating layers in particular) as the metal layers. If such a combination is adopted, coarse surfaces can be formed simply and reliably rather than by directly coarsening the surface of nickel. The copper plating layers in this case should preferably be formed with a thickness of 5 μm or greater for the sake of safety by taking into consideration the removed portion due to the coarsening treatment.

The material for forming the core board is not particularly limited, but a preferred core board is formed of a polymeric material as a principal constituent. As specific examples of the polymeric material for forming the core board, it is possible to cite, for example, EP resin (epoxy resin), PI resin (polyimide resin), BT resin (bismaleimide-triazine resin), PPE resin (polyphenylene ether resin), and the like. In addition, it is possible to use a composite material made of these resins and glass fibers (a glass woven fabric and a glass nonwoven fabric) or organic fibers such as polyamide fibers.

The laminated portion has a structure in which conductor layers and interlayer insulating layers formed of a polymeric material as a principal constituent are alternately connected. The laminated portion can be formed by a known method such as the buildup method. The laminated portion may be formed only on one side of the core board, or may be formed on both sides of the core board. It should be noted that, as for the laminated portion in which the via array capacitor is incorporated, a semiconductor device mounting portion is preferably set on its surface in a region corresponding to the via array capacitor. If a semiconductor device is mounted on such a semiconductor device mounting portion, the distance between the via array capacitor and the semiconductor device becomes shorter than in the case where the via array capacitor is incorporated in the core board, thereby making it possible to attain the stabilization of a power source due to the low inductance between the via array capacitor and the semiconductor device.

As a suitable method (in accordance with a second aspect of the invention) for manufacturing the wiring board incorporating a via array capacitor having the via array capacitor in accordance with the first aspect, it is possible to adopt the following method: A method of manufacturing a wiring board incorporating a via array capacitor, comprising: a preparing step of preparing a multi-product via array capacitors in which product regions to serve as the via array capacitors in accordance with the first aspect are arranged in plural rows longitudinally and transversely along a planar direction; a metal-containing layer forming step of forming metal-containing layers whose total thickness becomes not less than 15% and not more than 80% of the overall thickness of the via array capacitor, on at least one of a portion to serve as the first main surface and a portion to serve as the second main surface; a dividing step of dividing the multi-product via array capacitor to obtain the via array capacitors; and an incorporating step of incorporating the via array capacitor in a laminated portion in which interlayer insulating layers and conductor layers are alternately laminated on a core board.

Accordingly, according to this manufacturing method, as the total thickness of the metal-containing layers is set to not less than 15% and not more than 80% of the overall thickness of the via array capacitor, the proportion of the metal portions becomes high for the via array capacitor as a whole. As a result, the overall via array capacitor is reinforced by the metal portions, the flexibility improves, and its own strength also improves. Hence, even in a case where the overall thickness of the via array capacitor is made thin, it is possible to prevent the breakage of the via array capacitor. Therefore, as such a via array capacitor is incorporated, it is possible to attain improvement of the low height and reliability of the wiring board incorporating a via array capacitor.

As another suitable method (in accordance with a third aspect of the invention) for manufacturing the wiring board incorporating a via array capacitor having the via array capacitor in accordance with the first aspect, it is possible to adopt the following method: A method of manufacturing a wiring board incorporating a via array capacitor, comprising: a preparing step of preparing a ceramic unsintered body to become a multi-product via array capacitor in which product regions to serve as the via array capacitors for incorporation in a wiring board in accordance with the first aspect are arranged in plural rows longitudinally and transversely along a planar direction; a metal-containing layer forming step of forming metal-containing layers whose total thickness after firing becomes not less than 15% and not more than 80% of the overall thickness of the via array capacitor for incorporation in a wiring board after firing, on at least one of a portion to serve as the first main surface and a portion to serve as the second main surface in the ceramic unsintered body; a perforation forming step of forming perforations at boundary lines between adjacent ones of the product regions; a firing step of firing the ceramic unsintered body with the perforations formed therein to obtain the multi-product via array capacitor; a dividing step of dividing the multi-product via array capacitor along the perforations to obtain the via array capacitors; and an incorporating step of incorporating the via array capacitor in a laminated portion in which interlayer insulating layers and conductor layers are alternately laminated on a core board.

Accordingly, according to this manufacturing method, as the total thickness of the metal-containing layers is set to not less than 15% and not more than 80% of the overall thickness of the via array capacitor, the proportion of the metal portions becomes high for the via array capacitor as a whole. As a result, the overall via array capacitor is reinforced by the metal portions, the flexibility improves, and its own strength also improves. Hence, even in a case where the overall thickness of the via array capacitor is made thin, it is possible to prevent the breakage of the via array capacitor. Therefore, as such a via array capacitor is incorporated, it is possible to attain improvement of the low height and reliability of the wiring board incorporating a via array capacitor.

In addition, in manufacturing the via array capacitor having a thin overall thickness, if a general method is adopted in which a break groove is formed at a boundary line between adjacent ones of the product regions, and the multi-product via array capacitor is divided along the break groove in the dividing step, there is a possibility of the breaking of the via array capacitor. Accordingly, in the method in accordance with the third aspect, perforations are formed at the boundary line between adjacent ones of the product regions in the perforation forming step, and the multi-product via array capacitor is divided along the perforations in the dividing step. Hence, it is possible to prevent the breakage of the multi-product via array capacitor when the dividing step is carried out.

Further, after the dividing step, recessed portions and projecting portions are formed alternately and regularly at the four sides constituting outer peripheral portions of the via array capacitor along the direction in which the side extends. Accordingly, in a case where the via array capacitor is caused to sink into the interlayer insulating layer in an uncured state in the incorporating step, the recessed portions and the projecting portions serve as resistance, so that the via array capacitor is prevented from becoming positionally offset in the planar direction, thereby improving the positioning accuracy.

As another means (in accordance with a fourth aspect of the invention) for overcoming the problems of the invention, there is provided a via array capacitor for incorporation in a wiring board, comprising: a capacitor body including a first main surface and a second main surface and having a structure in which dielectric layers and inner electrode layers are alternately laminated; and a plurality of via conductors which conduct the inner electrode layers to each other and are, as a whole, arranged in array form; wherein the capacitor body has in its interior one or two or more reinforced metal layers which are thicker than the inner electrode layers, and a total of the thickness of the reinforced metal layer or reinforced metal layers is not less than 15% and not more than 80% of the overall thickness of the via array capacitor.

Therefore, according to the via array capacitor in accordance with the fourth aspect, by setting the total thickness of the reinforced metal layer or reinforced metal layers to not less than 15% and not more than 80% of the overall thickness of the via array capacitor, the proportion of the metal portions becomes high for the via array capacitor as a whole. As a result, the overall via array capacitor is reinforced by the metal portions, the flexibility improves, and its own strength improves, so that it is possible to prevent the breakage of the via array capacitor even in cases where the overall thickness of the via array capacitor is made thin.

If the total thickness of the reinforced metal layer or reinforced metal layers is less than 15% of the overall thickness of the via array capacitor, the effect to improvement of the above-described strength (flexibility) becomes small. On the other hand, if this total thickness exceeds 80%, the portion other than the reinforced metal layer or reinforced metal layers of the capacitor body becomes thin, so that the fabrication of the capacitor body becomes difficult. Hence, there is a possibility that the via array capacitor fails to exhibit its function as the capacitor.

It should be noted that the aforementioned reinforced metal layer may also function as the inner electrode layer, or may not function as the inner electrode layer. If the reinforced metal layer functions as the inner electrode layer, even if the proportion occupied by the reinforced metal layer or the reinforced metal layers in the capacitor body becomes large, the via array capacitor can be made to reliably function as the capacitor.

In addition, the reinforced metal layer should preferably be formed by using nickel, molybdenum, tungsten, titanium, copper, silver, or the like. In the case where the dielectric layers are a ceramic, a metallic material suitable for co-firing with the ceramic is selected. In particular, the reinforced metal layer should preferably be formed by using the same metallic material as the metal-containing layers.

It should be noted that the reinforced metal layer may be provided in the interior of the dielectric layer (e.g., in a case where the capacitor body consists of five dielectric layers, the third dielectric layer from the first main surface) located in the thicknesswise central portion of the capacitor body, or may be provided in the interior(s) of the dielectric layer(s) located in the vicinity of the first main surface and/or in the vicinity of the second main surface of the capacitor body. In the case where the reinforced metal layer is provided in the interior(s) of the dielectric layer(s) located in the vicinity of the first main surface and/or in the vicinity of the second main surface of the capacitor body, it is preferred that the reinforced metal layers be respectively provided in both the dielectric layer located in the vicinity of the first main surface and the dielectric layer located in the vicinity of the second main surface. By so doing, it is possible to reduce the irregularities, warpage, and waviness of the via array capacitor after firing.

As another means (in accordance with a fifth aspect of the invention) for overcoming the problems of the invention, there is provided a via array capacitor wherein a total volume of the inner electrode layers and the metal-containing layers is in a range of not less than 45 vol. % and not more than 95 vol. % of an aggregate volume of the via array capacitor itself.

Therefore, according to the via array capacitor in accordance with the fifth aspect, as the ratio of the total volume of the inner electrode layers and the metal-containing layers to the aggregate volume of the via array capacitor itself (in other words), as the volume ratio of the dielectric layers is decreased), specifically by setting the total volume of the inner electrode layers and the metal-containing layers in a range of not less than 45 vol. % and not more than 95 vol. %, it is possible to impart flexibility to the via array capacitor. In consequence, in the case where the via array capacitor is incorporated into the laminated portion of the wiring board, it is possible to withstand mechanical and thermal stresses which occur due to such as the warpage and deformation of the wiring board, making it possible to prevent the occurrence of cracks and ensure reliability. It should be noted that if the total volume of the inner electrode layers and the metal-containing layers is less than 45 vol. %, the brittleness of the dielectric layers becomes large, and the effect of improvement of flexibility based on the ratio of the total volume of the inner electrode layers and the metal-containing layers becomes small. On the other hand, if the total volume of the inner electrode layers and the metal-containing layers is more than 95 vol. %, it becomes difficult to laminate the dielectric layers, making it impossible to secure a sufficient electrostatic capacity.

In addition, the ratio of a metal component of the inner electrode layers and the metal-containing layers should preferably be 50 vol. % or greater. For instance, dielectric layers which are formed of a high dielectric constant ceramic or the like to electrically insulate the inner electrode layers are provided in the via array capacitor. To improve the adhesion between each of these dielectric layers and each of the metal-containing layers such as the inner electrode layers, a ceramic (common material) formed of such as the same composition as that used in the dielectric layers can be contained in the metal-containing layers such as the inner electrode layers. Namely, by setting the ratio of a metal component of the inner electrode layers and the metal-containing layers to 50 vol. % or greater, resilient behavior becomes large, and the flexibility of the via array capacitor can be improved. On the other hand, if the ratio of a metal component of the inner electrode layers and the metal-containing layers is less than 50 vol. %, the brittleness of the metal-containing layers due to the ceramic becomes large, increased resistance accompanied by a decline in conductivity occurs after firing, and a decline in the flexibility of the via array capacitor results, thereby making it impossible to ensure reliability.

In addition, the via array capacitor should preferably be formed with a thickness of not less than 10 μm and not more than 200 μm. As the thickness of the via array capacitor is set to not more than 200 μm, the via array capacitor can be satisfactorily incorporated into the laminated portion of the wiring board. If the via array capacitor becomes thicker than 200 μm, it becomes, for instance, difficult to flatly form the laminated portion of the wiring board incorporating the via array capacitor. To form the via array capacitor flatly, it becomes necessary to form the interlayer insulating layer thickly, and the wiring board itself has to be disadvantageously formed thickly, which runs counter to the demand for miniaturization.

When a jig having a pressing surface with a curved surface formed thereon is pressed against the via array capacitor, if it is assumed that a linear length in a planar direction of the via array capacitor is W, and that a bending distance in a thicknesswise direction thereof is d, the via array capacitor can preferably be bent in the thicknesswise direction in a range in which d/W is 0.01 or greater. In addition, the via array capacitor is deformable in a range of curvature in which the radius of curvature of the via array capacitor is 700 mm or less. If a via array capacitor falling outside the range of the invention is bent with a jig having a radius of curvature of more than 700 mm, a crack occurs in the via array capacitor. Namely, as the via array capacitor itself has such flexibility, even if the via array capacitor undergoes a mechanical stress or a thermal history in the step of incorporation into the laminated portion of the wiring board or due to the deformation of the wiring board, it is possible to obtain a via array capacitor which is capable of withstanding the stress and is reliable. In turn, it is possible to obtain a reliable wiring board.

As another means (in accordance with a sixth aspect of the invention) for overcoming the problems of the invention, there is provided a wiring board incorporating a via array capacitor comprising the via array capacitor according to the first or fifth aspect.

Therefore, according to the wiring board incorporating a via array capacitor in accordance with the sixth aspect, by setting the total thickness of the metal-containing layers or the reinforced metal layer (s) to not less than 15% and not more than 80% of the overall thickness of the via array capacitor, or by setting the total volume of the inner electrode layers and the metal-containing layers to not less than 45 vol. % and not more than 95 vol. % of the aggregate volume of the entire via array capacitor, the proportion of the metal portions becomes high for the via array capacitor as a whole. As a result, the overall via array capacitor is reinforced by the metal portions, the flexibility improves, and its own strength improves, so that it is possible to prevent the breakage of the via array capacitor even in cases where the overall thickness of the via array capacitor is made thin. Therefore, as such a via array capacitor is incorporated, it is possible to attain improvement of the low height and reliability of the wiring

BRIEF DESCRIPTION OF THE DRAWINGS

FIG. 22-1 to FIG. 22-4 are explanatory diagrams of a method of manufacturing the via array capacitor in accordance with the further embodiment.

Figure 1:
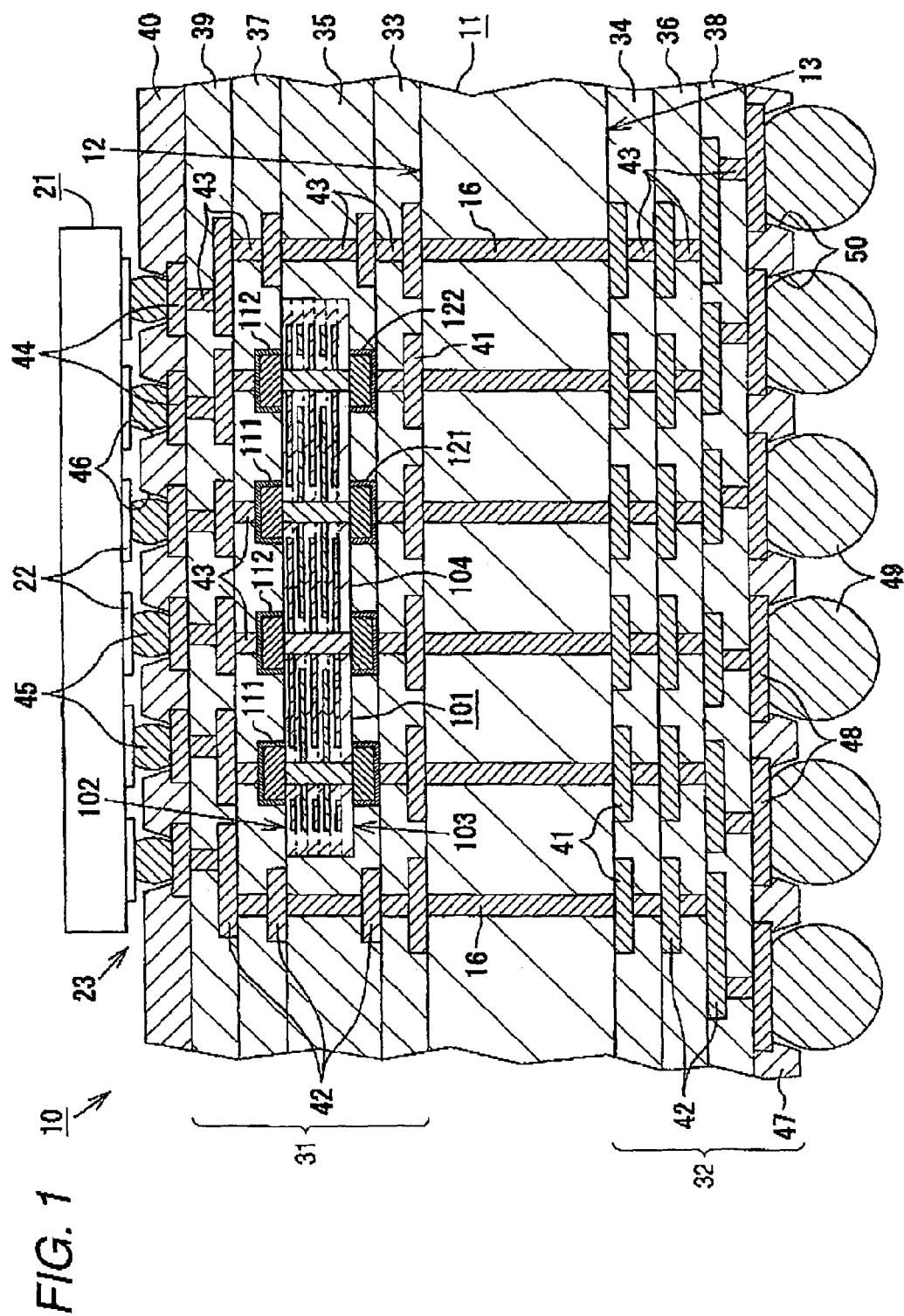
FIG. 1 is a schematic cross-sectional view illustrating a wiring board incorporating a via array capacitor in accordance with an embodiment of the invention.

Description of Reference Numerals and Signs:

| | |
|---|---|
| 10, 10000: | wiring boards incorporating a via array capacitor |
| 11: | core board |
| 31: | buildup layer serving as a laminated portion |
| 33, 35, 37, 39: | resin insulating layers serving as interlayer insulating layers |
| 42: | conductor layer |
| 100: | product region |
| 101, 61: | via array capacitors |
| 102: | upper surface serving as a first main surface |
| 103: | lower surface serving as a second main surface |
| 104: | capacitor body |
| 105, 63: | ceramic dielectric layer serving as a dielectric layer |
| 106: | side |
| 107: | recessed portion |
| 108: | projecting portion |
| 111, 112: | first outer terminal electrodes serving as metal containing layers and terminal electrodes |
| 118: | dummy electrode |
| 121, 122: | second outer terminal electrodes serving as metal-containing layers and terminal electrodes |
| 131: | first via conductor serving as a via conductor |
| 132: | second via conductor serving as a via conductor |
| 141: | first inner electrode layer serving as an inner electrode layer |
| 142: | second inner electrode layer serving as an inner electrode layer |
| 150: | ceramic unsintered body |
| 161: | multi-product via array capacitor |
| 162: | boundary line |
| 163: | perforation |
| 171: | reinforcing metal layer |
| B1: | thickness of the metal-containing layer disposed on the first main surface |
| B21: | thickness of the metal-containing layer disposed on the second main surface |
| A: | overall thickness of the via array capacitor |

DETAILED DESCRIPTION OF THE INVENTION

Referring now to the accompanying drawings, a detailed description will be given of an embodiment of a wiring board incorporating a via array capacitor in accordance with the invention.

As shown in FIG. 1, a wiring board 10 incorporating a via array capacitor in accordance with this embodiment is a wiring board for mounting on an IC chip, and is comprised of a substantially rectangular plate-shaped core board 11 which is formed of glass epoxy; a build up layer 31 (laminated portion) formed on an upper surface 12 of the core board 11; and a buildup layer 32 formed on a lower surface 13 of the core board 11. Via conductors 16 are formed at a plurality of portions in the core board 11. These via conductors 16 connect and conduct the upper surface 12 side and the lower surface 13 side of the core board 11. Further, conductor layers 41 formed of copper are respectively pattern-formed on the upper surface 12 and the lower surface 13 of the core board 11, and each conductor layer 41 is electrically connected to the via conductor 16.

The buildup layer 31 formed on the upper surface 12 of the core board 11 has a structure in which four resin insulating layers 33, 35, 37, and 39 (so-called interlayer insulating layers) formed of an epoxy resin, as well as a conductor layer 42 formed of copper, are alternately laminated. Terminal pads 44 are formed at a plurality of portions on the obverse surface of the fourth resin insulating layer 39 in the form of an array. Further, the obverse surface of the resin insulating layer 39 is practically entirely covered with a solder resist 40. Opening portions 46 for exposing the terminal pads 44 are formed at predetermined portions of the solder resist 40. A plurality of solder bumps 45 are respectively disposed on the surfaces of the terminal pads 44. Each solder bump 45 is electrically connected to a surface connection terminal 22 of an IC chip 21 which is a semiconductor device. It should be noted that the terminal pads 44 and the solder bumps 45 are located within the region immediately above a via array capacitor 101, and this region constitutes a semiconductor device mounting portion 23. In addition, via conductors 43 are respectively provided in the resin insulating layers 33, 35, 37, and 39. These via conductors 43 electrically connect the conductor layers 41 and 42 and the terminal pads 44 to each other.

As shown in FIG. 1, the buildup layer 32 formed on the lower surface 13 of the core board 11 has a structure substantially identical to that of the above-described buildup layer 31. Namely, the buildup layer 32 has a structure in which three resin insulating layers 34, 36, and 38 formed of an epoxy resin and the conductor layer 42 are alternately laminated. BGA pads 48, which are electrically connected to the conductor layers 42 via the via conductors 43, are formed at a plurality of portions on the lower surface of the third resin insulating layer 38 in the form of a lattice. Further, the lower surface of the resin insulating layer 38 is practically entirely covered with a solder resist 47. Opening portions 50 for exposing the BGA pads 48 are formed at predetermined portions of the solder resist 47. A plurality of solder bumps 49 for establishing electrical connection to an unillustrated motherboard are respectively disposed on the surfaces of the BGA pads 48. The wiring board 10 incorporating a via array capacitor shown in FIG. 1 is mounted on the unillustrated motherboard by means of the solder bumps 49.

Figure 2:
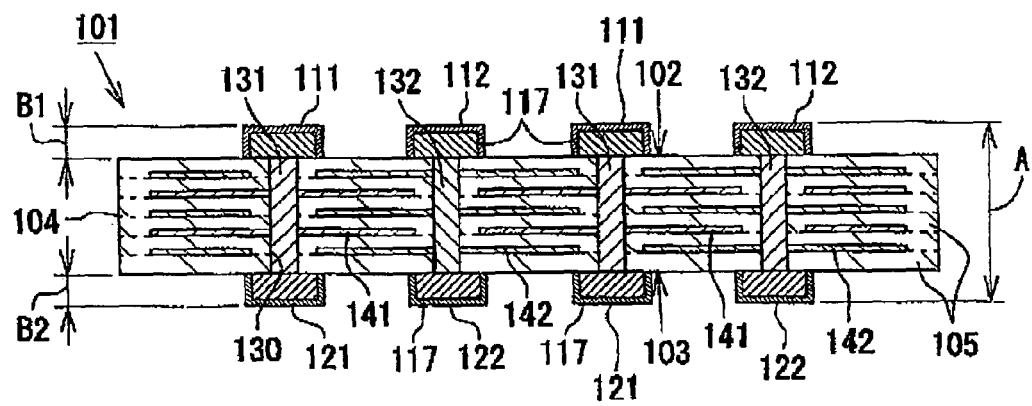
FIG. 2 is a schematic cross-sectional view illustrating the via array capacitor in accordance with the embodiment.
Figure 3:
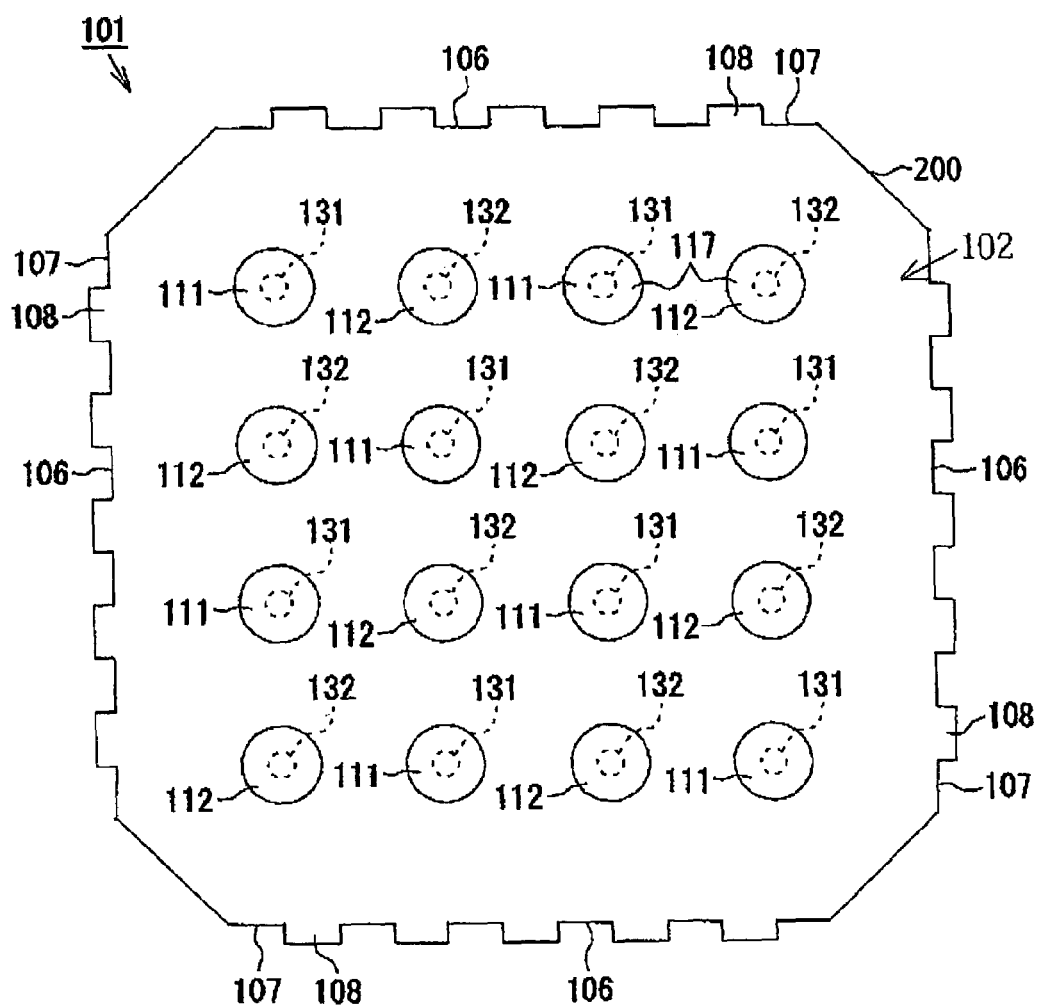
FIG. 3 is a schematic top view illustrating the via array capacitor in accordance with the embodiment.

The via array capacitor 101 shown in FIGS. 2, 3, etc. is incorporated in a central portion of the buildup layer 31. A capacitor body 104 for making up the via array capacitor 101, as seen in a plan view, has a substantially rectangular shape with four sides 106, and is a plate-like object which is 15.0 mm long, 15.0 mm wide, and 0.04 mm thick. Recessed portions 107 and projecting portions 108 are arranged alternately and regularly on each side 106 along the direction in which the side 106 extends. Namely, the lengths of each recessed portion 107 and each projecting portion 108 along the direction in which the side 106 extends are mutually equal, and the depths of the respective recessed portions 107 (the amounts of projection of the respective projecting portions 108) are mutually equal.

As shown in FIGS. 1 to 3, the capacitor body 104 has an upper surface 102 (first main surface) and a lower surface 103 (second main surface), and the aforementioned resin insulating layer 37 for constituting the buildup layer 31 is located on the upper surface 102, while the aforementioned resin insulating layer 33 for constituting the buildup layer 31 is located on the lower surface 103. The capacitor body 104 has a structure in which first inner electrode layers 141 (inner electrode layers) and second inner electrode layers 142 (inner electrode layers) are alternately laminated via a ceramic dielectric layer 105 (dielectric layer). The ceramic dielectric layer 105 consists of a sintered body of barium titanate, i.e., a kind of a high dielectric constant ceramic, and functions as a dielectric (insulator) between the first inner electrode layer 141 and the second inner electrode layer 142. The first inner electrode layers 141 and the second inner electrode layers 142 are layers which are formed of nickel as a principal constituent, and are arranged alternately inside the capacitor body 104.

As shown in FIGS. 2 and 3, a multiplicity of via holes 130 are formed in the capacitor body 104. These via holes 130 penetrate the capacitor body 104 in its thicknesswise direction, and are arranged on its entire surface in the form of a lattice (array). A plurality of via conductors 131 and 132 penetrating between the upper surface 102 and the lower surface 103 of the capacitor body 104 are formed in the respective via holes 130 by using nickel as a principal constituent. Namely, these via conductors 131 and 132 are also arranged over the entire surface in the form of a lattice (array). Each first via conductor 131 penetrates the respective first inner electrode layer 141, and makes them to electrically conduct with each other. Each second via conduct or 132 penetrates the respective second inner electrode layer 142, and makes them to electrically conduct with each other.

As shown in FIGS. 1 to 3, pluralities of first outer terminal electrodes 111 and 112 (terminal electrodes) serving as metal-containing layers are projectingly provided on the upper surface 102 of the capacitor body 104. These first outer terminal electrodes 111 and 112 are arranged over the entire upper surface 102 in the form of a lattice (array). The occupying area of the plurality of first outer terminal electrodes 111 and 112 which are present on the upper surface 102 is approximately 50% of the area of the upper surface 102. Meanwhile, pluralities of second outer terminal electrodes 121 and 122 (terminal electrodes) serving as metal-containing layers are projectingly provided on the lower surface 103 of the capacitor body 104. These second outer terminal electrodes 121 and 122 are arranged on the entire lower surface 103 in the form of a lattice (array). The occupying area of the plurality of second outer terminal electrodes 121 and 122 which are present on the lower surface 103 is approximately 50% of the area of the lower surface 103. Namely, the occupying area of the plurality of first outer terminal electrodes 111 and 112 and the occupying area of the plurality of second outer terminal electrodes 121 and 122 are mutually equal. In addition, the first outer terminal electrodes 111 and 112 on the upper surface 102 side are electrically connected to the aforementioned via conductors 43. Meanwhile, the second outer terminal electrodes 121 and 122 on the lower surface 103 side are electrically connected to electrodes (contacts) of the unillustrated motherboard via the via conductors 16 and 43, the conductor layers 41 and 42, the BGA pads 48, and the solder bumps 49. In addition, substantially central portions of bottom surfaces of the first outer terminal electrodes 111 and 112 are directly connected to upper surface 102-side end faces of the via conductors 131 and 132, while substantially central portions of bottom surfaces of the second outer terminal electrodes 121 and 122 are directly connected to lower surface 103-side end faces of the via conductors 131 and 132. Accordingly, the outer terminal electrodes 111 and 121 conduct with the via conductors 131 and the first inner electrode layers 141, while the outer terminal electrodes 112 and 122 conduct with the via conductors 132 and the second inner electrode layers 142.

As shown in FIG. 2, the thickness B1 of the first outer terminal electrodes 111 and 112 in this embodiment is 20 μm, and the thickness B2 of the second outer terminal electrodes 121 and 122 is also 20 μm. The first outer terminal electrodes 111 and 112 and the second outer terminal electrodes 121 and 122 are set to mutually the same thickness. In addition, the overall thickness of the via array capacitor 101 in this embodiment becomes 80 μm. It should be noted that the ratio between, on the one hand, the total of the thickness B1 of the first outer terminal electrodes 111 and 112 and the thickness B2 of the second outer terminal electrodes 121 and 122 and, on the other hand, the overall thickness A of the via array capacitor 101 can be determined from the formula (B1+B2)/A. As a result, the total (40 μm) of the thickness B1 of the first outer terminal electrodes 111 and 112 and the thickness B2 of the second outer terminal electrodes 121 and 122 becomes 50% of the overall thickness A of the via array capacitor 101.

Figure 4:
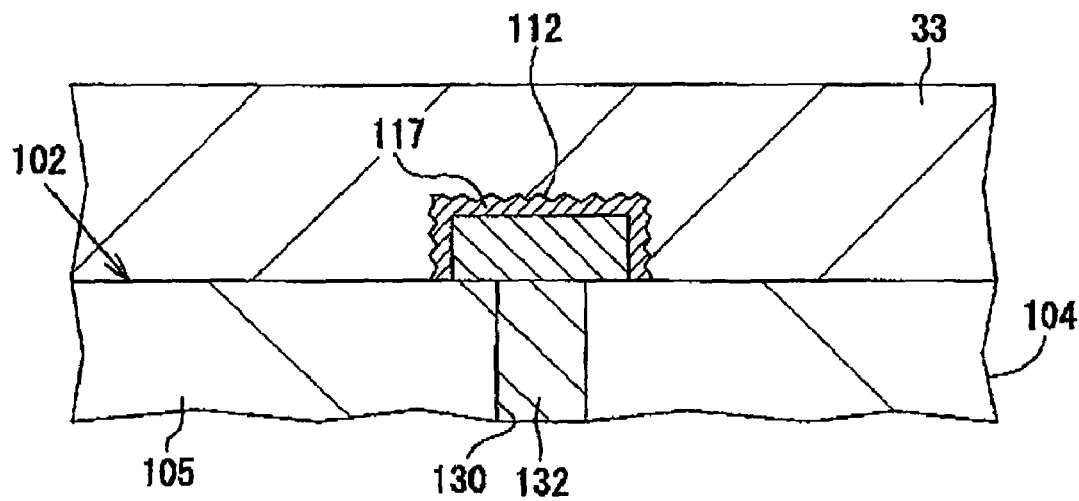
FIG. 4 is a schematic cross-sectional view of essential portions of the via array capacitor in accordance with the embodiment.

As shown in FIG. 2, the first outer terminal electrodes 111 and 112 are formed of nickel as a principal material, and contain as a common material a small amount of barium titanate, i.e., the same material as the material constituting the ceramic dielectric layer 105. The surfaces of the first outer terminal electrodes 111 and 112 are entirely covered with copper plating layers 117 (metal layers). Likewise, the second outer terminal electrodes 121 and 122 are also formed of nickel as a principal material, and contain a small amount of barium titanate as a common material, and their surfaces are also covered with copper plating layers. Namely, the copper plating layers 117 are formed of a metal softer than the metal constituting the outer terminal electrodes 111, 112, 121, and 122. As shown in FIG. 4, since the surfaces of the copper plating layers 117 have been coarsened, the surfaces of the first outer terminal electrodes 111 and 112 are coarser than the upper surface 102 of the capacitor body 104. Similarly, the surfaces of the second outer terminal electrodes 121 and 122 are also coarser than the lower surface 103 of the capacitor body 104. It should be noted that the surface roughness Ra of the copper plating layer 117 in this embodiment is set to approximately 0.5 μm.

In addition, the thickness of the first inner electrode layer 141 and the second inner electrode layer 142 is 2 μm. The diameter of the via hole 130 is 100 μm, and 500 via holes are formed with a predetermined pattern. The volume ratio of the total of the inner electrode layers and the metal-containing layers is 54 vol. % of the entire via array capacitor 101.

In addition, the ratio of the metal component of the first inner electrode layers 141, the second inner electrode layers 142, and the metal-containing layers is set to 50% or greater.

In addition, as shown in FIG. 3, the outer shape of each of the outer terminal electrodes 111, 112, 121, and 122, when viewed in a direction (first main surface direction) perpendicular to the upper surface 102, is circular. It should be noted that in this embodiment the diameter of each of the outer terminal electrodes 111, 112, 121, and 122 is set to approximately 495 μm, and a minimum length of the pitch is set to approximately 580 μm.

Furthermore, chamfered portions 200 are respectively formed at the four corners of the via array capacitor 101. As the chamfered portions 200 are formed, the via array capacitor 101 is capable of alleviating the shock at the time of handling, and is capable of preventing the occurrence of a gap with respect to the buildup layer 31 when the via array capacitor 101 is incorporated in the buildup layer, which hence leads to improvement of adhesion between the via array capacitor and the buildup layer since there is no gap.

When electric conduction is effected from the motherboard side via the second outer terminal electrodes 121 and 122 to apply a voltage across the first inner electrode layers 141 and the second inner electrode layers 142, positive charges, for example, are accumulated in the first inner electrode layers 141, while negative charges, for example, are accumulated in the second inner electrode layers 142. As a result, the via array capacitor 101 functions as a capacitor. In addition, in this via array capacitor 101, the first via conductors 131 and the second via conductors 132 are respectively disposed adjacent to each other, and are set such that the directions of current flowing through the first via conductors 131 and the second via conductors 132 become opposite to each other. A reduction of the inductance component is thereby attained.

Next, a description will be given of the method of manufacturing the wiring board 10 incorporating a via array capacitor in accordance with this embodiment.

Figure 5:
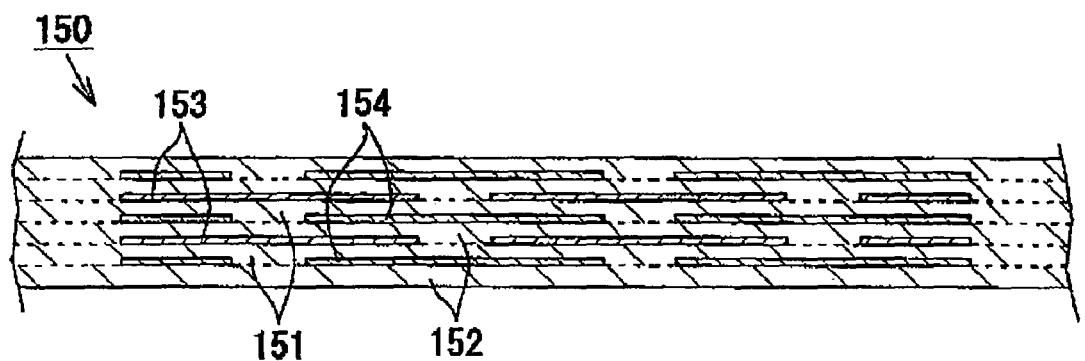
FIG. 5 is an explanatory diagram of a method of manufacturing a wiring board incorporating a via array capacitor in accordance with the embodiment.

In a preparing step, the core board 11 and a ceramic unsintered body 150 (see FIG. 5) are respectively fabricated by conventionally known techniques, and are prepared in advance. It should be noted that the ceramic unsintered body 150 is a plate-shaped member which is formed into a multi-product via array capacitor 161 in which product regions 100 (see FIG. 8) to serve as the via array capacitors 101 are arranged in plural rows longitudinally and transversely along the planar direction.

Figure 9:
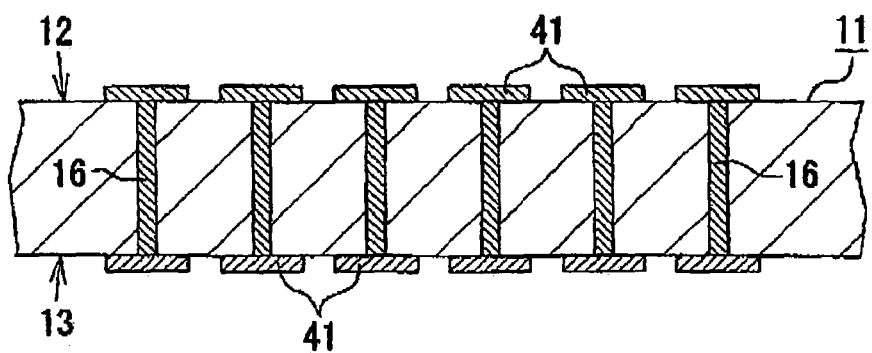
FIG. 9 is an explanatory diagram of the method of manufacturing a wiring board incorporating a via array capacitor in accordance with the embodiment.

The core board 11 is fabricated as follows. First, a copper clad laminate is prepared which is clad with 35 μm-thick copper foil on both sides of a base material which is 415 mm long, 410 mm wide, and 0.87 mm thick. Next, drilling is performed on the copper clad laminate by using a drill machine, whereby through holes (not shown) for forming the via conductors 16 are formed in advance at predetermined positions. The via conductors 16 are formed by performing electroless copper plating on the overall surfaces of the copper clad laminate to fill the interiors of the through holes with the copper plating. Further, the copper foil on both surfaces of the copper clad laminate is subjected to etching so as to pattern the conductor layers 41 by the subtractive process, for example. Specifically, after electroless copper plating, electrolytic copper plating is performed by using this electroless copper plating layer as a common electrode. This electrolytic copper plating layer is further laminated with a dry film, and as exposure and development are carried out with respect to the dry film, the dry film is formed into a predetermined pattern. In this state, an unnecessary electrolytic copper plating layer, electroless copper layer, and copper foil are removed by etching. Subsequently, the core board 11 is obtained by exfoliating the dry film (see FIG. 9).

In addition, the ceramic unsintered body 150 is fabricated as follows. Namely, ceramic green sheets 151 and 152 are formed, and nickel paste for inner electrode layers is screen-printed on these green sheets 151 and 152 and is allowed to dry. In consequence, first inner electrode portions 153 and second inner electrode portions 154, which respectively serve as the first inner electrode layers 141 and the second inner electrode layers 142 later, are formed. Next, the green sheets 151 each having the first inner electrode portions formed thereon and the green sheets 152 each having the second inner electrode portions formed thereon are alternately laminated, and a pressing force is imparted thereto in the laminated direction of the sheets so as to integrate the green sheets 151 and 152, thereby obtaining the ceramic unsintered body 150 (see FIG. 5).

Figure 6:
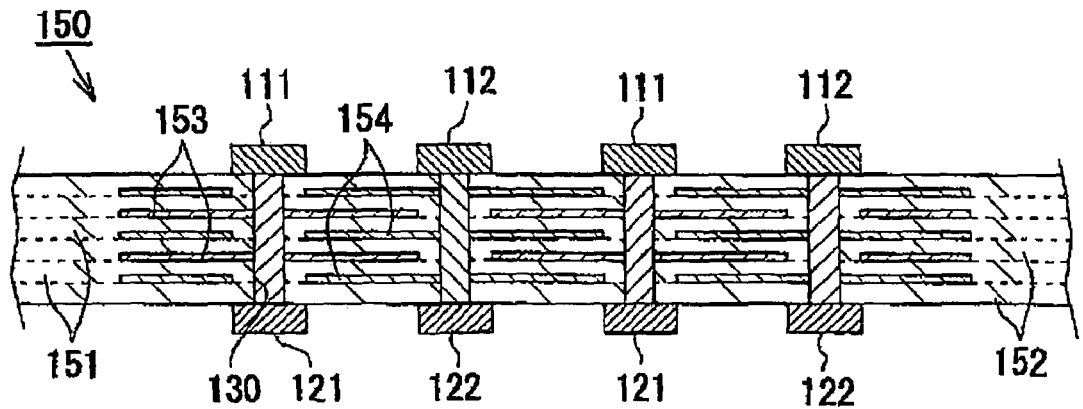
FIG. 6 is an explanatory diagram of the method of manufacturing a wiring board incorporating a via array capacitor in accordance with the embodiment.

Furthermore, the via holes 130 are penetratingly formed in the ceramic unsintered body 150 by using a laser processing machine, and nickel paste for via conductors is filled into the respective via holes 130 by using an unillustrated paste press-fitting and filling device. In an ensuing outer-terminal-electrode forming step (metal-containing layer forming step), paste is printed on a portion which serves as the upper surface 102 in the ceramic unsintered body 150, thereby forming the first outer terminal electrodes 111 and 112 on the upper surface side of the ceramic unsintered body 150 in such a manner as to cover the upper end faces of the respective conductors. Also, paste is printed on a portion which serves as the lower surface of the ceramic unsintered body 150, thereby forming the second outer terminal electrodes 121 and 122 on the lower surface side of the ceramic unsintered body 150 in such a manner as to cover the lower end faces of the respective conductors (see FIG. 6). It should be noted that the outer terminal electrodes 111, 112, 121, and 122 are formed such that the total thickness (B1+B2) after firing becomes approximately 50% of the overall thickness A of the via array capacitor 101 after firing.

Figure 7:
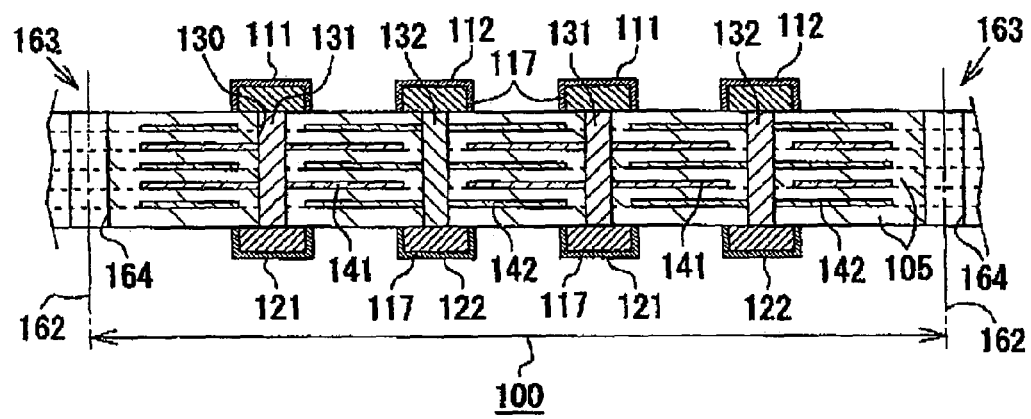
FIG. 7 is an explanatory diagram of the method of manufacturing a wiring board incorporating a via array capacitor in accordance with the embodiment.
Figure 8:
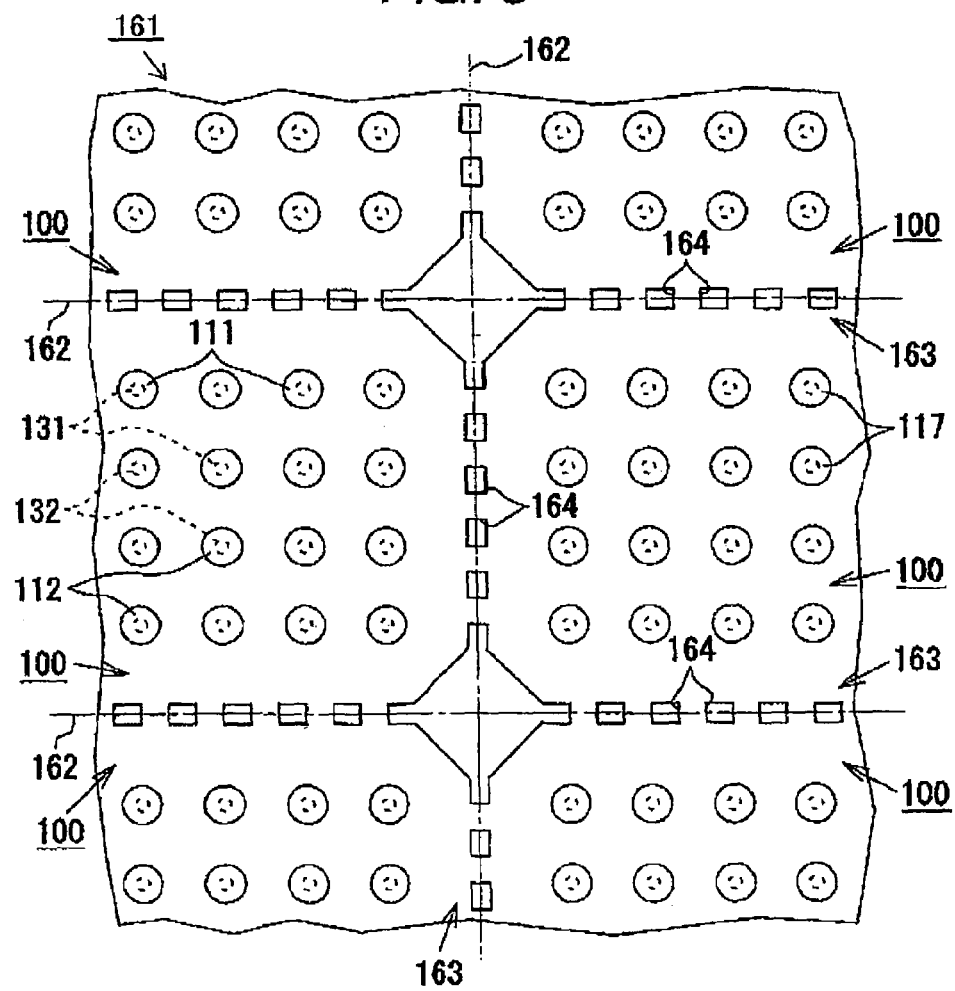
FIG. 8 is an explanatory diagram of the method of manufacturing a wiring board incorporating a via array capacitor in accordance with the embodiment.

In an ensuing perforation forming step, perforations 163 are formed at boundary lines 162 between adjacent ones of the product regions 100 by using a laser processing machine (see FIGS. 7 and 8). It should be noted that the perforations 163 are formed as rectangular through holes 164 penetrating the ceramic unsintered body 150 in its thicknesswise direction are provided at predetermined intervals along the boundary lines 162. The shape of the through holes 164 is not particularly restricted, and it is possible to cite, for example, a rectangular shape, a circular shape, and the like. It should be noted that, as a method of forming the plurality of through holes, it is possible to cite a mechanical method such as one in which drilling is performed on the ceramic unsintered body by using a drill machine, or one in which drilling is performed by using a punching pin or punching die having a plurality of punching pins. In the invention, however, since a via array capacitor whose overall thickness is thin is produced, it is not preferable to impart mechanical shocks to the ceramic unsintered body whose thickness is thin. Therefore, in the formation of the plurality of through holes, it is preferable to use a nonmechanical method such as one in which drilling is performed by using laser light radiated from a laser processing machine.

In an ensuing firing step, the drying of the ceramic unsintered body 150 with the perforations 163 formed therein is carried out to allow the surface terminal portions to solidify to some extent. Then, the ceramic unsintered body 150 is degreased, and firing for a predetermined time is carried out at a predetermined temperature. As a result, barium titanate and nickel in the paste are simultaneously sintered to provide the multi-product via array capacitor 161. The formation of the perforations is facilitated since the perforations are formed in the state of the ceramic unsintered body which is softer than the multi-product via array capacitor after the firing. In addition, since the firing step is carried out before a dividing step, as compared with the case where divided ceramic unsintered bodies are separately fired, the number of manhours decreases and the production improves.

Next, electroless copper plating (with a thickness of 10 μm or thereabouts) is performed with respect to the outer terminal electrodes 111, 112, 121, and 122. As a result, the copper plating layer 117 is formed on the outer terminal electrodes 111, 112, 121, and 122. Further, the coarsening (cz treatment) of the surfaces of the copper plating layers 117 on the outer terminal electrodes 111, 112, 121, and 122 is performed (see FIG. 4). This makes it possible to ensure the adhesion with the resin insulating layers 33 and 37. It should be noted that since the electroless copper plating is slightly thick at 10 μm or thereabouts, the thickness of copper can be secured even after the copper plating layers 117 have undergone the coarsening. After completion of the coarsening, a cleaning step is carried out. It should be noted that instead of providing the copper plating layers 117 on the respective outer terminal electrodes 111, 112, 121, and 122, a coupling agent may be applied to ensure the adhesion with the resin insulating layers 33 and 37.

After completion of the cleaning step, the dividing step is carried out. Specifically, the multi-product via array capacitor 161 is divided along the perforations 163 to obtain a plurality of the via conductors 101. As a method of dividing the multi-product via array capacitor, it is possible to cite, among others, a method in which the multi-product via array capacitor held by an operator is divided by being bent along the perforations and a method in which the multi-product via array capacitor is divided by inserting a cutting blade along the perforations and cutting the multi-product via array capacitor. Following this, at each side 106 of the capacitor body 104 of each via array capacitor 101, the recessed portions 107 and projecting portions 108 are formed alternately and regularly along the direction in which the side 106 extends.

Figure 10:
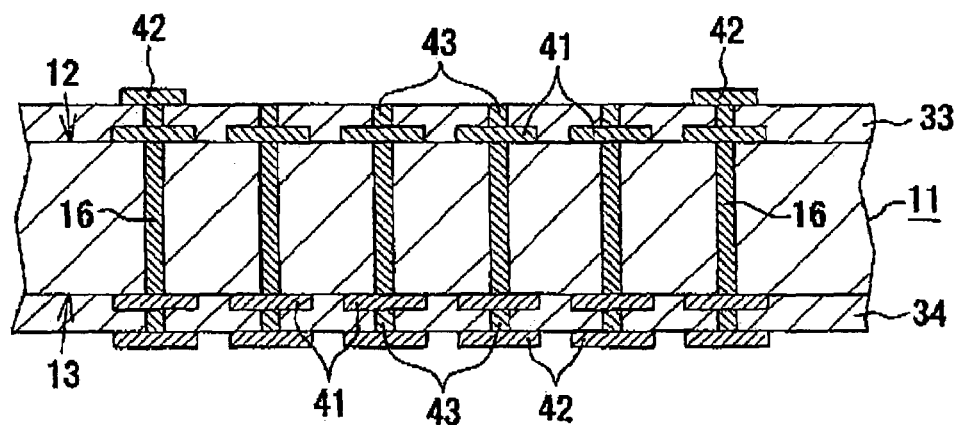
FIG. 10 is an explanatory diagram of the method of manufacturing a wiring board incorporating a via array capacitor in accordance with the embodiment.

In an ensuing buildup layer forming step, the buildup layer 31 and the buildup layer 32 are respectively formed on the upper surface 12 and the lower surface 13 of the core board 11 in accordance with a conventionally known technique. To give a detailed description, sheet-like thermosetting epoxy resin is first laminated on the upper surface 12 and the lower surface 13 of the core board 11 to thereby form the first resin insulating layers 33 and 34 having blind holes at positions where the via conductors 43 are to be formed by the laser processing machine. It should be noted that the resin insulating layers 33 and 34 may be formed by applying liquid thermosetting epoxy resin instead of laminating the sheet-like thermosetting epoxy resin. Next, electrolytic copper plating is performed in accordance with a conventionally known technique (e.g., a semi-additive process) to thereby form the via conductors 43 inside the blind holes and form the conductor layers 42 on the resin insulating layers 33 and 34 (see FIG. 10). It should be noted that portions of the via conductors 43 thus formed (the via conductors 43 in which the conductor layers 42 are not connected to their upper end faces) project slightly from the upper surface of the resin insulating layer 33 (the illustration is omitted).

Then, the sheet-like thermosetting epoxy resin is laminated on the first resin insulating layers 33 and 34 to form the second resin insulating layers 35 and 36 which are in an uncured state. It should be noted that the resin insulating layers 35 and 36 in the uncured state may be formed by applying liquid thermosetting epoxy resin instead of laminating the sheet-like thermosetting epoxy resin. At this point of time, the buildup layer forming step is temporarily suspended, and an incorporating step is carried out.

Figure 11:
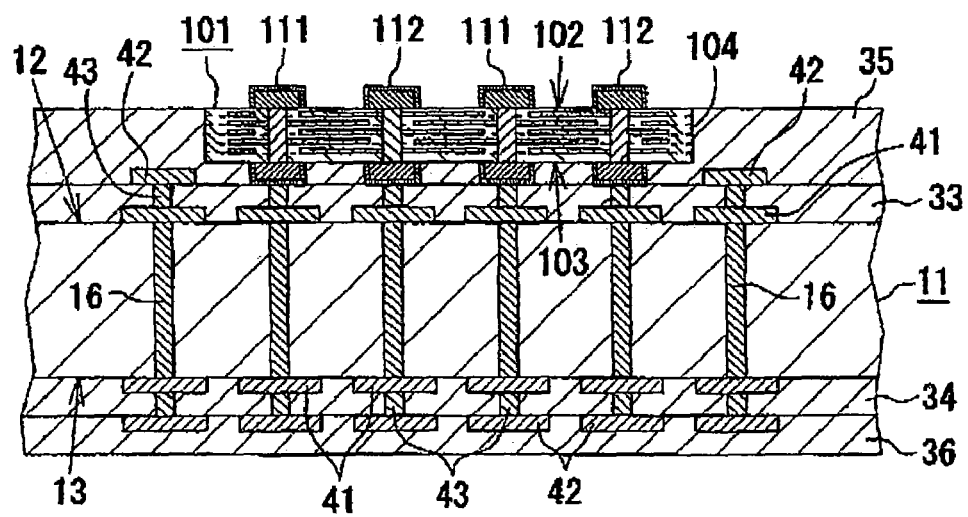
FIG. 11 is an explanatory diagram of the method of manufacturing a wiring board incorporating a via array capacitor in accordance with the embodiment.

In the incorporating step, the via array capacitor 101 is disposed on the resin insulating layer 33 by using a mounting device (see FIG. 11). At this time, as the via array capacitor 101 is pressed downward, the via array capacitor 101 sinks into the resin insulating layer 35 in the uncured state, and reaches the top of the resin insulating layer 33. At this time, the via array capacitor 101 is prevented from becoming positionally offset in the planar direction since the recessed portions 107 and the projecting portions 108 formed at each side 106 of the capacitor body 104 serves as resistance. It should be noted that since the via array capacitor 101 is pressed downward, the second outer terminal electrodes 121 and 122 of the via array capacitor 101 are reliably brought into contact with the projecting portions of the via conductors 43 inside the resin insulating layer 33. Here, since the occupying area of the plurality of second outer terminal electrodes 121 and 122 is set to approximately 50% of the area of the lower surface 103, the proportion of the coarsened metal portions at the bonding interface with the resin insulating layer 33 becomes large, so that the adhesive strength with respect to the resin insulating layer 33 improves. It should be noted that, in the incorporating step, drilling may be performed with respect to the resin insulating layer 35 in a cured state by using a laser processing machine, and the via array capacitor 101 may be disposed in an accommodating recess formed as a result of it. Still alternatively, a film with an accommodating hole formed in advance may be attached to form the resin insulating layer 35, and the via array capacitor 101 may be disposed in an accommodating recess formed as a result of it.

Here, the via array capacitor 101 is disposed on the resin insulating layer 33, but the via array capacitor 101 may be disposed directly on the core board 11, or the via array capacitor 101 may be disposed on the resin insulating layer (35, 37, or 39) on the side away from the core board 11. The closer to the core board 11 the via array capacitor 101 is, the more easily the via array capacitor 101 can be supported stably by the core board 11. Meanwhile, the more distant from the core board 11 the via array capacitor 101 is, the shorter the distance between the via array capacitor 101 and the semiconductor device (IC chip 21) mounted in a semiconductor device mounting region becomes. As a result, since the inductance between the via array capacitor and the semiconductor device decreases more reliably, it is possible to attain further stabilization of the power source.

After completion of the incorporating step, the buildup layer forming step is resumed. Specifically, by means of the laser processing machine, blind holes are formed in the second resin insulating layers 35 and 36 in the uncured state at positions where the via conductors 43 are to be formed. Also, the resin insulating layers 35 and 36 are allowed to cure. Next, electrolytic copper plating is carried out in accordance with a conventionally known technique so as to form the via conductors 43 in the blind holes and form the conductor layers 42 on the resin insulating layers 35 and 36.

Next, the sheet-like thermosetting epoxy resin is laminated on the second resin insulating layers 35 and 36 to thereby form the third resin insulating layers 37 and 38 having blind holes at positions where the via conductors 43 are to be formed by the laser processing machine. Here, the third resin insulating layers 37 and 38 are formed with the same thickness as the first resin insulating layers 33 and 34. It should be noted that the resin insulating layers 37 and 38 may be formed by applying liquid thermosetting epoxy resin instead of laminating the sheet-like thermosetting epoxy resin. In consequence, the first outer terminal electrodes 111 and 112 of the via array capacitor 101 come into contact with the resin insulating layer 37. It should be noted that since the occupying area of the plurality of first outer terminal electrodes 111 and 112 is set to approximately 50% of the area of the upper surface 102, the proportion of the coarsened metal portions at the bonding interface with the resin insulating layer 37 becomes large, so that the adhesive strength with respect to the resin insulating layer 37 improves. Furthermore, electrolytic copper plating is carried out in accordance with a conventionally known technique so as to form the via conductors 43 inside the blind holes, form the via conductors 42 on the resin insulating layer 37, and form the BGA pads 48 on the resin insulating layer 38. It should be noted that the buildup layer 32 is completed at this stage.

Figure 12:
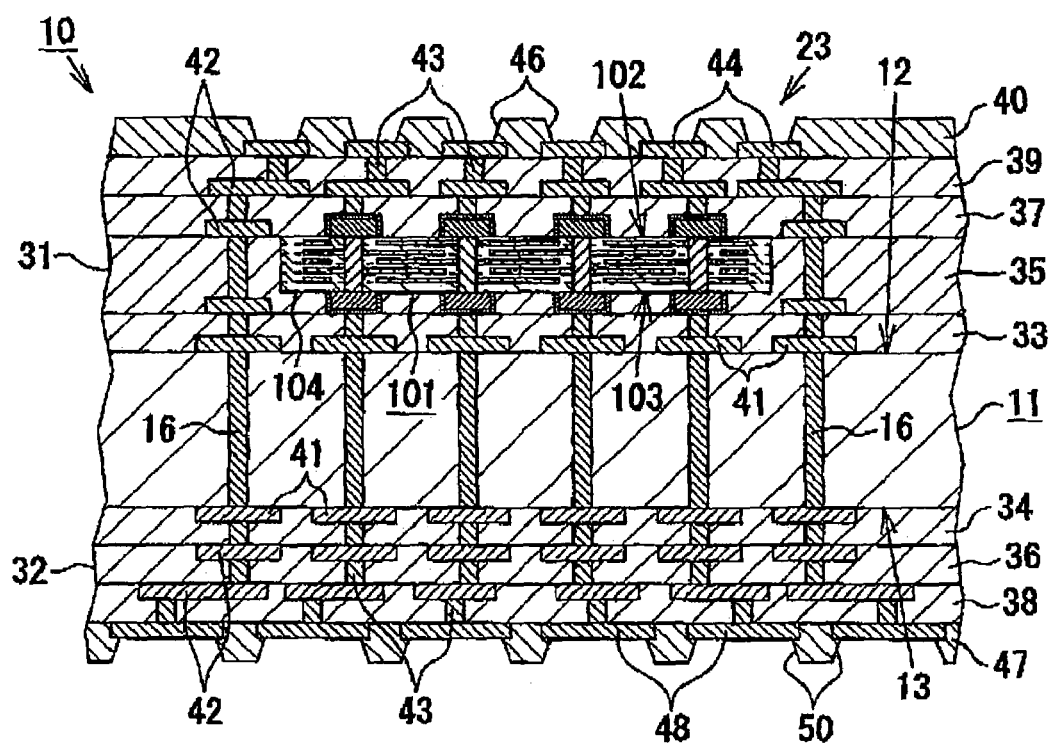
FIG. 12 is an explanatory diagram of the method of manufacturing a wiring board incorporating a via array capacitor in accordance with the embodiment.

Next, the sheet-like thermosetting epoxy resin is laminated on the third resin insulating layers 37 to thereby form the fourth resin insulating layer 39 having blind holes at positions where the via conductors 43 are to be formed by the laser processing machine. It should be noted that the resin insulating layer 39 may be formed by applying liquid thermosetting epoxy resin instead of laminating the sheet-like thermosetting epoxy resin. Then, electrolytic copper plating is carried out in accordance with a conventionally known technique so as to form the via conductors 43 inside the blind holes and form the terminal pads 44 on the resin insulating layer 39. It should be noted that the buildup layer 32 is completed at this stage. In consequence, the wiring board 10 incorporating a via array capacitor constituted by the core board 11 and the buildup layers 31 and 32 and incorporating the via array capacitor 101 in the buildup layer 31 is completed (see FIG. 12).

Next, a description will be given of a method of evaluation of the via array capacitor 101 and its results.

First, samples for measurement were prepared as follows. A via array capacitor was prepared in which the total of the thickness of the first outer terminal electrodes disposed on the obverse surface and the thickness of the second outer terminal electrodes disposed on the reverse surface was 50% of the overall thickness of the via array capacitor, and the total volume of the inner electrode layers and the metal-containing layers was 54 vol. % of the overall volume of the via array capacitor. This sample for measurement was used as Example 1. Namely, a via array capacitor similar to the via array capacitor 101 in accordance with this embodiment was used as Example 1.

In addition, a via array capacitor was prepared in which the total of the thickness of the first outer terminal electrodes disposed on the obverse surface and the thickness of the second outer terminal electrodes disposed on the reverse surface was 50% of the overall thickness of the via array capacitor, and the total volume of the inner electrode layers and the metal-containing layers was 40 vol. % of the overall volume of the via array capacitor. This sample for measurement was used as Example 2. Namely, the via array capacitor used in Example 2 was one in which the thickness of the first outer terminal electrodes and the thickness of the second outer terminal electrodes was 10 μm (Ni paste: 3 μm, electroless plating: 7 μm), the capacitor body was 15.0 mm long, 15.0 mm wide, and 0.04 mm thick, and the thickness of each of the first inner electrode layers 141 and the second inner electrode layers 142 was 2 μm.

In addition, a via array capacitor was prepared in which the total of the thickness of the first outer terminal electrodes disposed on the obverse surface and the thickness of the second outer terminal electrodes disposed on the reverse surface was 9% of the overall thickness of the via array capacitor, and the total volume of the inner electrode layers and the metal-containing layers was 90 vol. % of the overall volume of the via array capacitor. This sample for measurement was used as Example 3. Namely, the via array capacitor used in Example 3 was one in which the thickness of the first outer terminal electrodes and the thickness of the second outer terminal electrodes was 2 μm (Ni paste alone: 2 μm), the capacitor body was 15.0 mm long, 15.0 mm wide, and 0.04 mm thick, and the thickness of each of the first inner electrode layers 141 and the second inner electrode layers 142 was 6 μm.

In addition, a via array capacitor was prepared in which the total of the thickness of the first outer terminal electrodes and the thickness of the second outer terminal electrodes was 10% of the overall thickness of the via array capacitor, and the total volume of the inner electrode layers and the metal-containing layers was 33 vol. % of the overall volume of the via array capacitor. This sample for measurement was used as Comparative Example. Namely, the via array capacitor used in Comparative Example was one in which the thickness of the first outer terminal electrodes and the thickness of the second outer terminal electrodes was 2.2 μm, the capacitor body was 15.0 mm long, 15.0 mm wide, and 0.04 mm thick, and the thickness of each of the first inner electrode layers 141 and the second inner electrode layers 142 was 2 μm. It should be noted that, in the respective samples for measurement (Examples 1 to 3 and Comparative Example), the occupying area of the first outer terminal electrodes was set to approximately 50% of the area of the obverse surface, and the occupying area of the second outer terminal electrodes was set to approximately 50% of the area of the reverse surface.

(1) Strength Test

A load withstand test was conducted with respect to the respective samples for measurement at the same press pressure as at the time of laminating the resin insulating layers 33 to 39. Specifically, a pressing force (1 Mpa) was applied (by a vacuum heat press) in the thicknesswise direction of the sample for measurement while effecting heating under a vacuum of 1 Pa to assume a temperature of 100° C. The sample for measurement after the load withstand test was then visually observed.

As a result of making such an observation, in Comparative Example, the occurrence of a crack was noted in the sample for measurement. Meanwhile, in Examples 1 to 3, no occurrence of a crack was noted in the samples for measurement. Accordingly, it was verified that if the total of the thickness of the first outer terminal electrodes and the thickness of the second outer terminal electrodes is set to 50% of the overall thickness of the via array capacitor, a crack does not occur in the via array capacitor. In addition, it was also verified that if the total volume of the inner electrode layers and the metal-containing layers is set to not less than 45 vol. % and not more than 95 vol. % of the overall volume of the via array capacitor, a crack does not occur in the via array capacitor.

Figure 19:
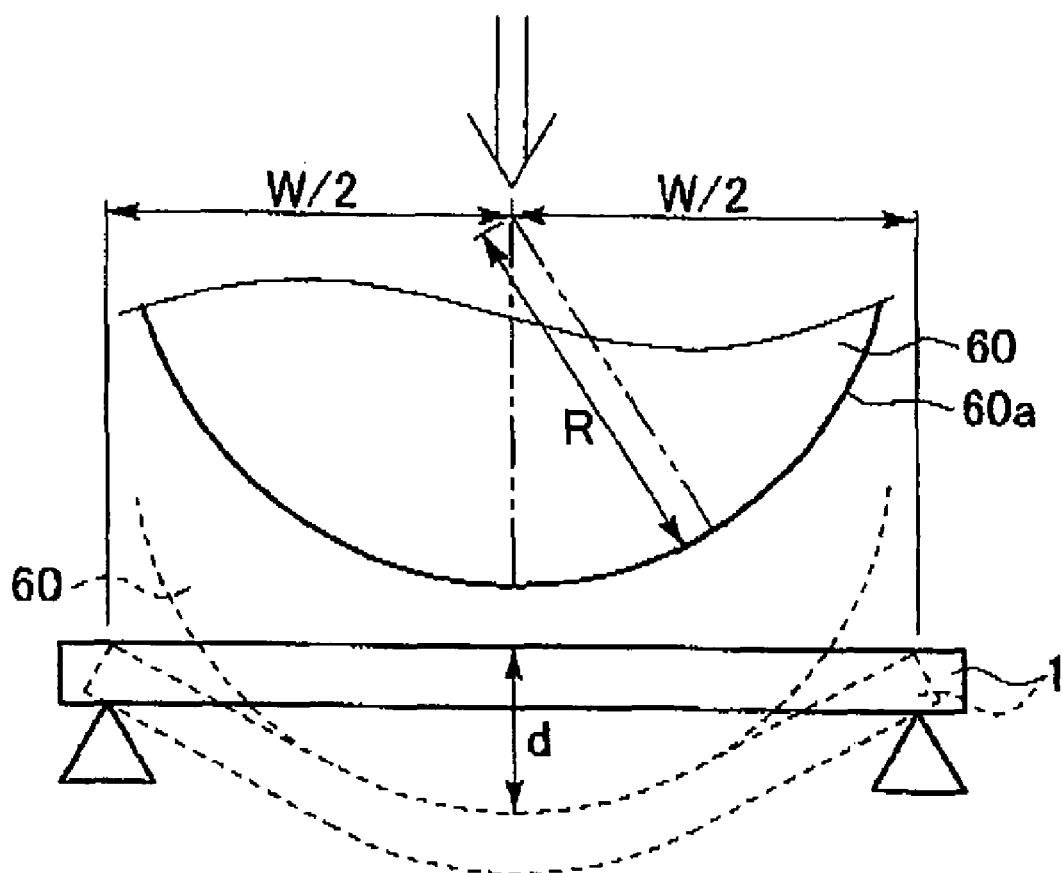
FIG. 19 is a conceptual diagram illustrating a measurement method.

In addition, electrical characteristics (capacitor capacity and withstand voltage) were measured with respect to each sample for measurement, and the amount of change before (2) Bending Test To measure the bending strength, as shown in a conceptual diagram in FIG. 19 illustrating a measurement method, a number of kinds of jigs 60 were fabricated which respectively had pressing surfaces 60a on which curved surfaces (curvatures) with various radii of curvature R were formed. The jigs 60 were respectively pressed against the via array capacitors of Example 1 and Comparative Example until the surface of the via array capacitor assumed a state conforming to the pressing surface 60. The radius of curvature R of the pressing jig 60, as well as the bending distance d in the thicknesswise direction with respect to the linear length w in a planar direction of the via array capacitor, were recorded and measured. It should be noted that the bendable radius of curvature R and the bendable distance d were determined on the basis of whether or not the via array capacitor subsequently fractured.

As a result of the experiment, as shown in Table 1, in Example 1, when the jig 60 in which the radius of curvature R of the pressing surface 60a was 550 mm was pressed against the via array capacitor, the via array capacitor could be bent up to 0.2 mm in terms of the thicknesswise bending distance d when the linear distance W in the planar direction of the sample was 15 mm. In addition, the occurrence of a crack and the deterioration of the electrical characteristics were not noted after the bending.

TABLE 1

| | BENDING TEST (mm) | RADIUS OF CURVATURE (mm) | LOAD WITHSTANDING TEST | | |
| --- | --- | --- | --- | --- | --- |
| | | | PRESENCE OR ABSENCE OF CRACK | ELECTRICAL CHARACTERISTICS | RELIABILITY TEST |
| EXAMPLE 1 | 0.2 mm | 550 mm | Good | Good | Good |
| COMPARATUVE EXAMPLE | 0.05 mm | 2250 mm | Bad | Bad | Bad | and after the load withstand test was evaluated. As a result of making such a measurement, in Comparative Example, both the capacitor capacity and the withstand voltage after the load withstand test declined as compared with those before the load withstand test. On the other hand, in Examples 1 to 3, both the capacitor capacity and the withstand voltage did not change before and after the load withstand test. Accordingly, it was verified that if the total of the thickness of the first outer terminal electrodes and the thickness of the second outer terminal electrodes is set to 50% of the overall thickness of the via array capacitor, electrical characteristics do not deteriorate. In addition, it was also verified that if the total volume of the inner electrode layers and the metal-containing layers is set to not less than 45 vol. % and not more than 95 vol. % of the overall volume of the via array capacitor, electrical characteristics do not deteriorate.

Accordingly, even though the samples for measurement of Examples 1 to 3 were incorporated in the buildup layers 31 in the buildup layer forming step, no cracks occurred in the samples for measurement. Furthermore, a thermal shock test was conducted by immersing the wiring board incorporating a via array capacitor alternately in a −55° C. liquid tank and a +125° C. liquid tank in 1000 cycles, and a capacity value and a resistance value before and after the test were measured. As a result, no changes were noted in the capacity value and the resistance value before and after the test. Therefore, it was possible to fabricate a highly reliable wiring board 10 incorporating a via array capacitor.

In Comparative Example, when the jig 60 in which the radius of curvature R of the pressing surface 60a was 2250 mm was pressed against the via array capacitor, the via array capacitor could be bent only up to 0.05 mm in terms of the thicknesswise bending distance d when the linear distance W in the planar direction of the via array capacitor was 15 mm. In addition, the occurrence of a crack and the deterioration of the electrical characteristics were noted in the via array capacitor itself after the bending.

As described above, it was possible to obtain a reliable via array capacitor in Example 1. Namely, it was possible to impart flexibility by setting the total volume of the inner electrode layers and the metal-containing layers contained in the via array capacitor to a range of not less than 45 vol. % and not more than 95 vol. %. Specifically, the via array capacitor has such a bending strength that the via array capacitor is resiliently deformable in a range in which the radius of curvature of the via array capacitor is 700 mm or less (not less than 20 mm and not more than 550 mm). As a result, it was possible to withstand mechanical and thermal stresses which could occur due to such as the warpage and deformation of a multilayered wiring board when the via array capacitor is incorporated in the multilayered wiring board, and it was possible to ensure reliability without the deterioration of the electrical characteristics. On the other hand, in Comparative Example, the volume ratio of the metal-containing layers was insufficient, the via array capacitor was not flexible, and a crack occurred with practically no bending.

Accordingly, it is possible to obtain the following advantages in accordance with this embodiment.

(1) According to the wiring board 10 incorporating a via array capacitor in accordance with this embodiment, as the total of the thickness B1 of the first outer terminal electrodes 111 and 112 and the thickness B2 of the second outer terminal electrodes 121 and 122 is set to 50% of the overall thickness A of the via array capacitor 101, the proportion of the metal portions becomes high for the via array capacitor 101 as a whole. As a result, the overall via array capacitor 101 is reinforced by the metal portions, the flexibility improves, and its own strength also improves. Hence, even in a case where the overall thickness of the via array capacitor 101 is made thin, it is possible to prevent the breakage of the via array capacitor 101. Therefore, as such a via array capacitor 101 is incorporated, it is possible to attain improvement of the low height and reliability of the wiring board 10 incorporating a via array capacitor, and reinforce the wiring board 10 incorporating a via array capacitor.

(2) The via array capacitor in accordance with this embodiment is thin so as to be incorporated in the buildup layer 31, and irregularities, warpage, and waviness are likely to occur after firing. Accordingly, in this embodiment, since the thickness B1 of the first outer terminal electrodes 111 and 112 and the thickness B2 of the second outer terminal electrodes 121 and 122 are made relatively thick, it is possible to reduce the irregularities, warpage, and waviness of the via array capacitor 101 after firing.

(3) In this embodiment, the occupying area of the plurality of first outer terminal electrodes 111 and 112 on the upper surface 102 is relatively large, and the occupying area of the plurality of second outer terminal electrodes 121 and 122 on the lower surface 103 is relatively large. For this reason, the adhesive strength between the via array capacitor 101 and the resin insulating layers 33 and 37 for constituting the buildup layer 31 improves. In addition, since irregularities on the upper surface 102 are overcome to some extent, the flatness. (coplanarity) of the mounting surface at the obverse surface of the buildup layer 31 improves, allowing the IC chip 21 to be easily mounted thereon with high reliability. For these reasons, it is possible to prevent the occurrence of the lifting up or delamination of the buildup layers 31 and 32 due to thermal expansion and the like, so that it is possible to impart high reliability.

(4) In this embodiment, since semiconductor device mounting portion 23 of the buildup layer 31 is located in a region immediately above the via array capacitor 101, the semiconductor device mounting portion 23 is supported by the via array capacitor 101 which has high strength for its thin thickness and in which irregularities, warpage, and waviness are suppressed. Hence, in the semiconductor device mounting portion 23, the mounting surface at the obverse surface of the buildup layer 31 is difficult to be deformed, and the flatness (coplanarity) can be enhanced, so that the IC chip 21 mounted on the semiconductor device mounting portion 23 can be supported more stably. Therefore, as the IC chip 21, it is possible to use an IC chip of a large size of 10 mm square or more and a low-k (low dielectric constant) IC chip.

It should be noted that the embodiment of the invention may be modified as follows.

Figure 13:
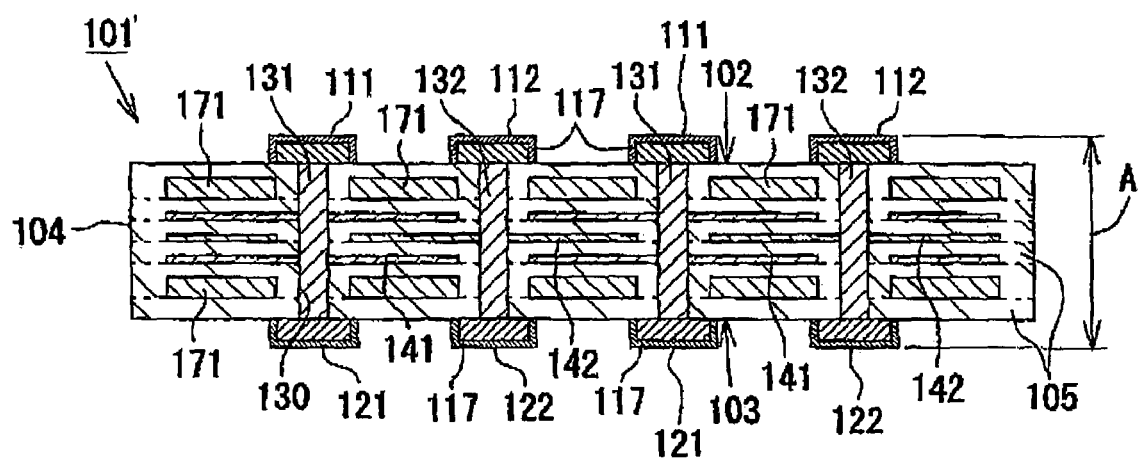
FIG. 13 is a schematic cross-sectional view illustrating a via array capacitor in accordance with another embodiment.
Figure 14:
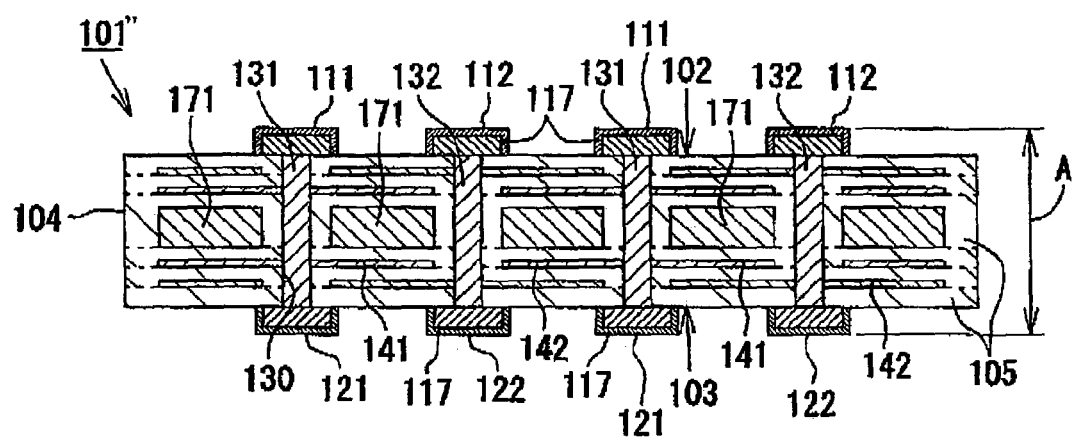
FIG. 14 is a schematic cross-sectional view illustrating a via array capacitor in accordance with still another embodiment.

In the above-described embodiment, the total of the thickness B1 of the first outer terminal electrodes 111 and 112 and the thickness B2 of the second outer terminal electrodes 121 and 122 is set to 50% of the overall thickness A of the via array capacitor 101. However, as shown in FIG. 13, reinforcing metal layers 171, which are thicker than the inner electrode layers 141 and 142, may be respectively provided in the ceramic dielectric layers 105 located in the vicinities of the upper surface 102 and the lower surface 103 of the capacitor body 104, and the total thickness of the reinforcing metal layers 171 may be set to, for example, 50% of the overall thickness of a via array capacitor 101'. In addition, as shown in FIG. 14, the reinforcing metal layer 171 may be provided in the interior of the ceramic dielectric layer 105 (in FIG. 14, the third ceramic dielectric layer 105 from the upper surface 102) located in the thicknesswise central portion of the capacitor body 104, and the thickness of the reinforcing metal layer 171 may be set to, for example, 50% of the overall thickness of a via array capacitor 101". It should be noted that the reinforcing metal layers 171 may be respectively provided in three or more different ceramic dielectric layers 105.

Even if the construction is thus provided, the proportion of the metal portions becomes high for the via array capacitor 101 as a whole, with the result that the overall via array capacitor 101 is reinforced by the metal portions, the flexibility improves, and its own strength improves. Therefore, it is possible to prevent the breakage of the via array capacitor 101.

In addition, the reinforcing metal layers 171 shown in FIGS. 13 and 14 maybe made to function as inner electrode layers by being conducted with the via conductors 131 and 132. By so doing, even if the proportion occupied by the reinforced metal layers 171 in the capacitor body 104 becomes large, the via array capacitor 101 can be reliably made to function as a capacitor.

Figure 15:
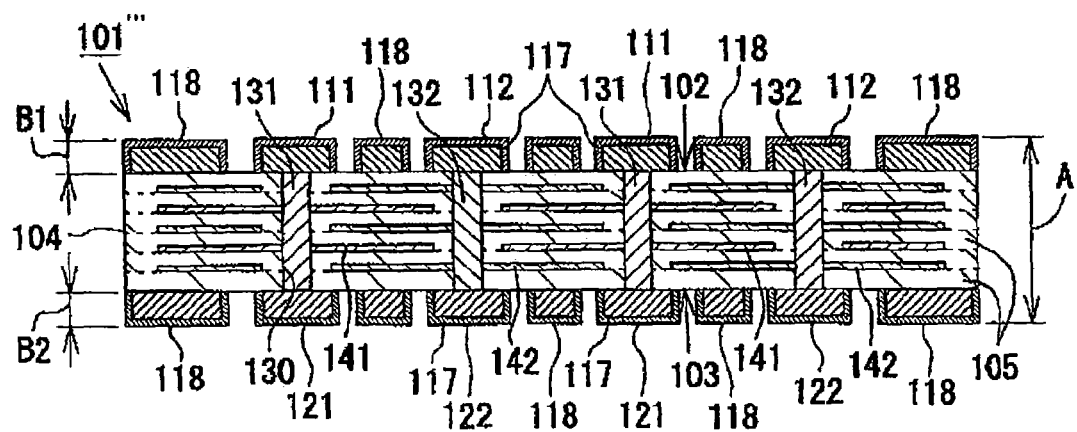
FIG. 15 is a schematic cross-sectional view illustrating a further via array capacitor in accordance with a further embodiment.
Figure 16:
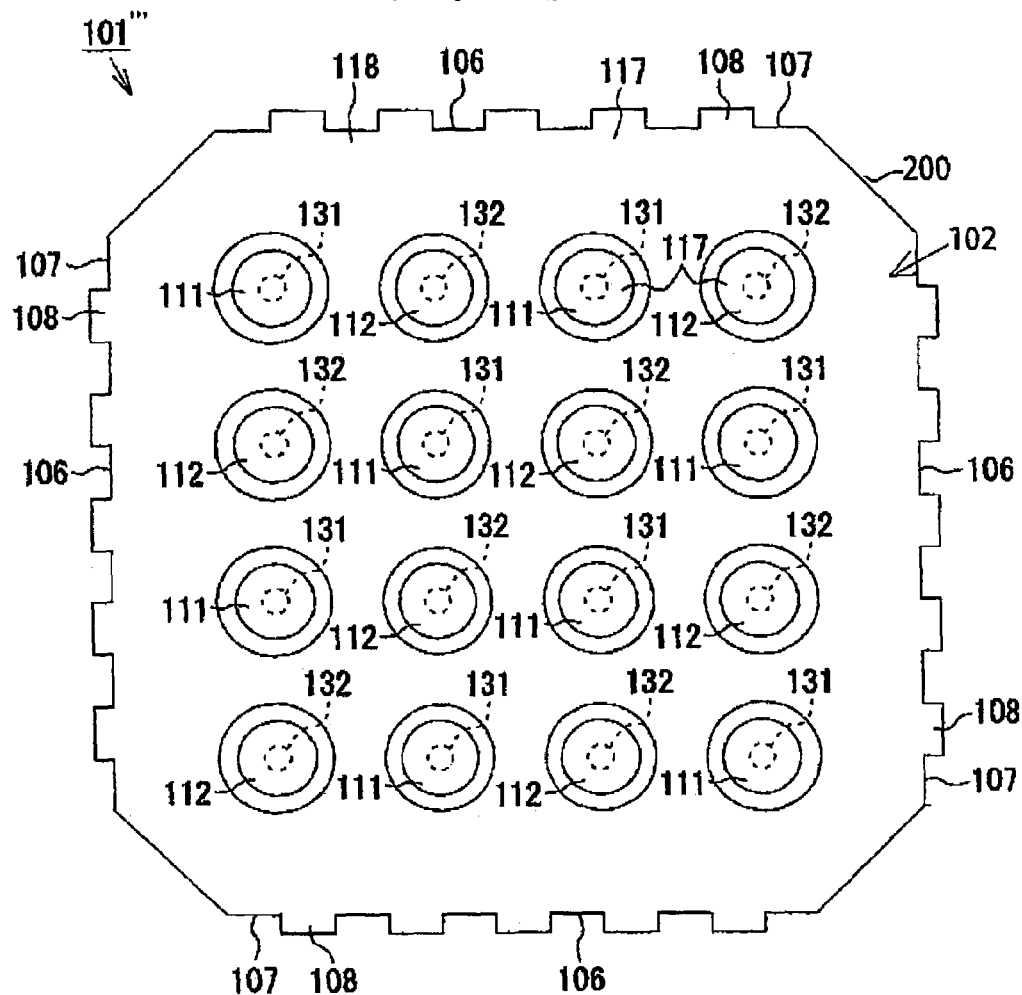
FIG. 16 is a schematic top view illustrating the via array capacitor in accordance with the further embodiment.

As shown in FIGS. 15 and 16, dummy electrodes 118 which do not conduct with the via conductors 131 and 132 may be disposed in regions where the outer terminal electrodes 111, 112, 121, and 122 are not present on the upper surface 102 and the lower surface 103. If the construction is thus provided, as a result of the fact that, in addition to the outer terminal electrodes 111, 112, 121, and 122, the dummy electrodes 118 are provided on the upper surface 102 and the lower surface 103, the proportion of the metal-containing layers (the outer terminal electrodes 111, 112, 121, and 122 and the dummy electrodes 118) at the bonding interface with the resin insulating layers 33 and 37 for constituting the buildup layer 31 becomes large. For example, the occupying area of the first outer terminal electrodes 111 and 112 and the dummy electrodes 118 becomes approximately 68% of the area of the upper surface 102, and the occupying area of the second outer terminal electrodes 121 and 122 and the dummy electrodes 118 becomes approximately 68% of the area of the lower surface 103. As a result, the adhesive strength between a via array capacitor 101''' and the resin insulating layers 33 and 37 improves. In addition, since irregularities on the upper surface 102 and the lower surface 103 are overcome to some extent, the flatness (coplanarity) of the mounting surface at the obverse surface of the buildup layer 31 improves, so that the mounting reliability after the mounting of the IC chip 21 can be improved.

Figure 17:
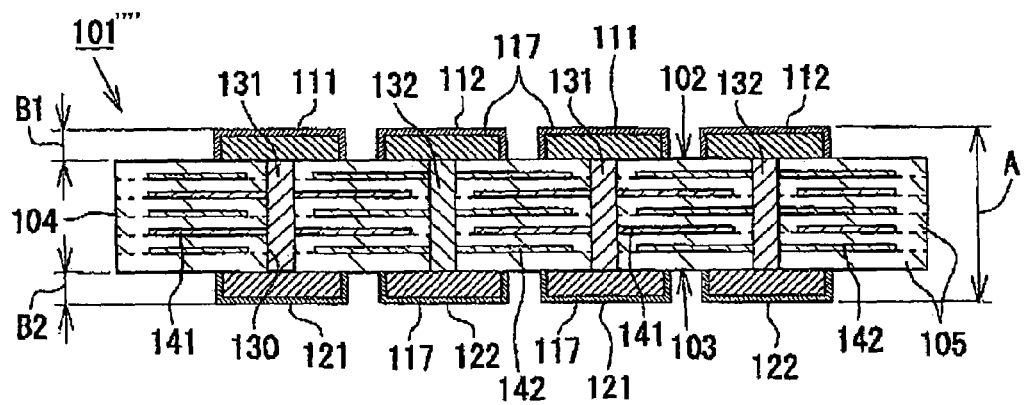
FIG. 17 is a schematic cross-sectional view illustrating a via array capacitor in accordance with a still further embodiment.
Figure 18:
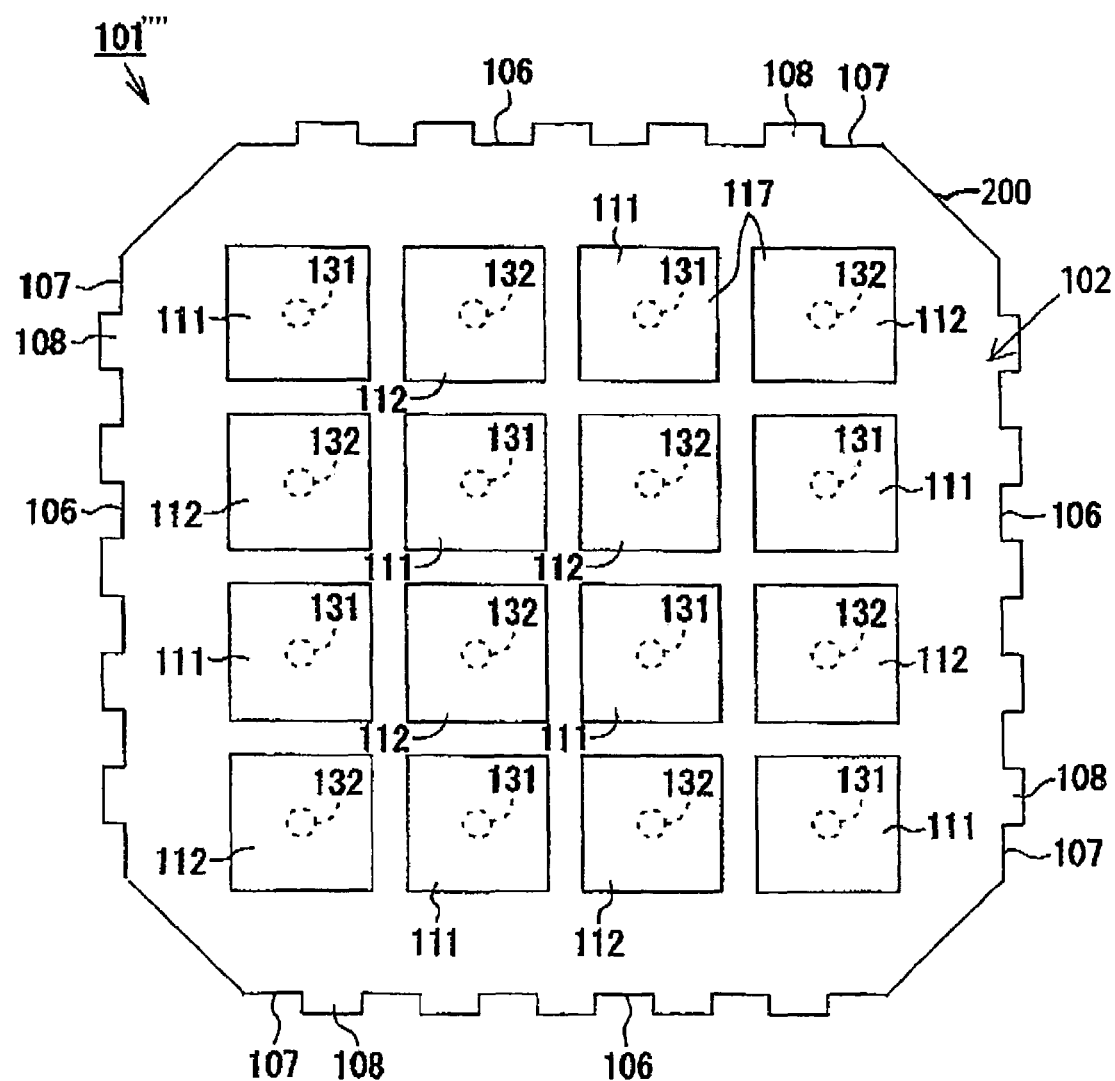
FIG. 18 is a schematic top view illustrating the via array capacitor in accordance with the still further embodiment.

As shown in FIGS. 17 and 18, the occupying area of the first outer terminal electrodes 111 and 112 which are present on the upper surface 102 may be made large, and the occupying area of the second outer terminal electrodes 121 and 122 which are present on the lower surface 103 may be made large. For example, the occupying area of the first outer terminal electrodes 111 and 112 may be made approximately 68% of the area of the upper surface 102, and the occupying area of the second outer terminal electrodes 121 and 122 may be made approximately 68% of the area of the lower surface 103. By so doing, the proportion of the metal-containing layers (the outer terminal electrodes 111, 112, 121, and 122) at the bonding interface with the resin insulating layers 33 and 37 for constituting the buildup layer 31 becomes large. As a result, the adhesive strength between a via array capacitor 101″″ and the resin insulating layers 33 and 37 improves. In addition, since irregularities on the upper surface 102 and the lower surface 103 are overcome to some extent, the flatness (coplanarity) of the mounting surface at the obverse surface of the buildup layer 31 improves, so that the mounting reliability after the mounting of the IC chip 21 can be improved.

In the above-described embodiment, the first outer electrode layers 111 and 121 are disposed on the upper surface 102 of the capacitor body 104, and the second inner electrode layers 121 and 122 are disposed on the lower surface 103, but the first outer electrode layers 111 and 121 or the second inner electrode layers 121 and 122 may be omitted.

In the above-described embodiment, the outer shape of each of the outer terminal electrodes 111, 112, 121, and 122, when viewed in the direction perpendicular to the upper surface 102, is circular. However, the outer shape of each of the outer terminal electrodes 111, 112, 121, and 122 may be a shape other than the circular shape. For example, as shown in FIG. 18, the outer shape of each of the outer terminal electrodes 111, 112, 121, and 122 may be a square shape.

Figure 20:
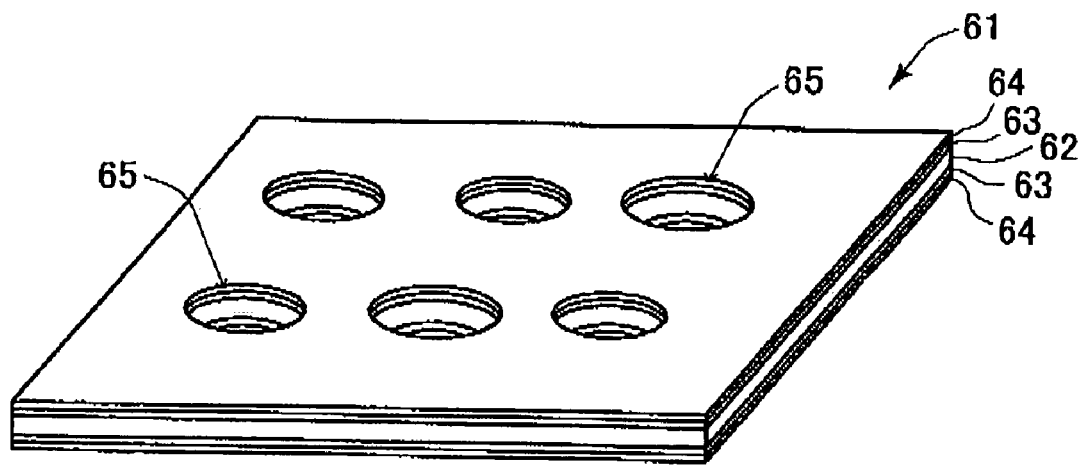
FIG. 20 is a schematic perspective view illustrating a via array capacitor in accordance with a further embodiment.
Figure 21:
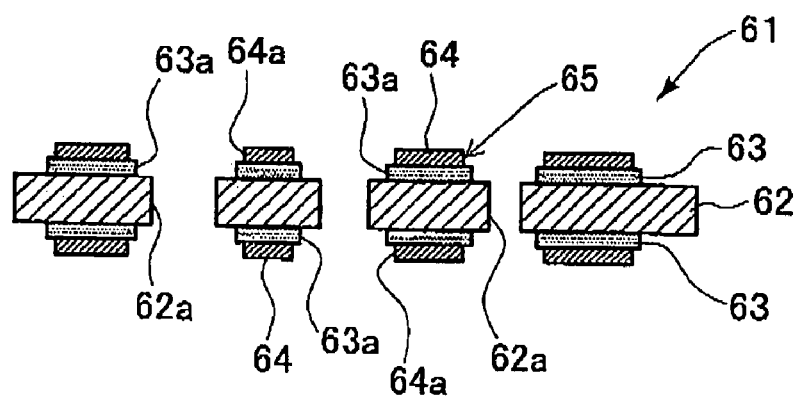
FIG. 21 is a schematic cross-sectional view illustrating the via array capacitor in accordance with the further embodiment.

In addition, as another embodiment, the via array capacitor may be one shown in FIGS. 20 and 21. As shown in FIGS. 20 and 21, a via array capacitor 61 includes metal foil (inner electrode layer) 62 formed of a conductive material such as nickel; first and second dielectric layers 63 formed of a high dielectric constant ceramic such as barium titanate; and first and second metal electrodes (inner electrode layers) 64 formed of a conductive material such as nickel. Each of the first and second dielectric layers 63 and each of the first and second metal electrodes 64 are laminated in that order on both obverse and reverse surfaces of the metal foil 62, and the via array capacitor 61 is formed in a state in which the metal foil 62 and the first and second metal electrodes 64 are electrically insulated from each other. The via array capacitor 61 is formed in the form of a plate which is square or rectangular in a plan view. In addition, a plurality of communicating holes 65, which are circular in a plan view and communicate in the thicknesswise direction, are provided in the via array capacitor 61 with a predetermined pattern, and are formed with a number of different diameters. The communicating holes 65 are formed with greater diameters in stages from the metal foil 62 toward the first and second dielectric layers 63 and toward the first and second metal layers 64. The first and second dielectric layers 63 and the first and second metal electrodes 64, including the communicating holes 65, are formed symmetrically with the metal foil 62 positioned in between. It should be noted that the first and second dielectric layers 63 and the first and second metal electrodes 64 may be formed only on one surface of the metal foil 62. However, as the first and second dielectric layers 63 and the first and second metal electrodes 64 are formed symmetrically on both obverse and reverse surfaces of the metal foil 62, it is possible to suppress the warpage which is likely to occur due to the difference in the coefficient of thermal expansion between the metal foil 62 and the first and second dielectric layers 63.

By appropriately adjusting the conditions of the respective elements, the via array capacitor 61 having the above-described structure in this embodiment can be formed so as to satisfy the range in which the total volume of the inner electrode layers and the metal-containing layers is set to not less than 45 vol. % and not more than 95 vol. % of the total volume of the via array capacitor 61. Here, the respective elements are the volume (size and thickness) of the via array capacitor 61, the thickness of the metal foil 62, the thickness of the first and second dielectric layers 63, and the thickness of the first and second metal electrodes 64. In addition, since the metal-containing layers are not present in this embodiment, the "total volume of the inner electrode layers and the metal-containing layers" is the volume of the metal foil 62 plus the volume the inner electrode layers, i.e., the first and second conductor layers 64. Further, the inner electrode layers can be formed such that the percentage of the metal components becomes 50% or more. As a result, the via array capacitor body 61 is provided with sufficient flexibility since its resilient behavior becomes large.

Next, referring to FIG. 22, a description will be given of a method of manufacturing the via array capacitor 61. First, as shown in FIG. 22 (22-1), the metal foil 62 is prepared which is made of nickel or the like and formed, for example, with a size of 150 mm square and a thickness of not less than 10 μm and not more than 40 μm, and through holes 62a are formed with a predetermined pattern by etching or the like.

Subsequently, barium titanate green sheets before firing, which are formed with a size of 150 mm square and a thickness of not less than 0.3 μm and not more than 10 μm and serve as the first and second dielectric layers 63 after firing, are respectively laminated on both obverse and reverse surfaces of the metal foil 62 having the through holes 62a, and are press bonded under predetermined conditions. The barium titanate green sheets are obtained by forming thin film of a barium titanate slurry on carrier sheets 63s of polyester or the like by a known doctor blade method, and by allowing the thin film to dry. The barium titanate green sheets are laminated on both obverse and reverse surfaces of the metal foil 62, and are subsequently press bonded under predetermined conditions, and the carrier sheets 63s are peeled off.

Figures 1, 22:
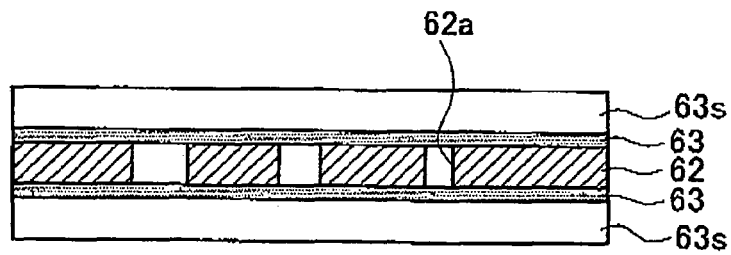
Figures 2, 22:
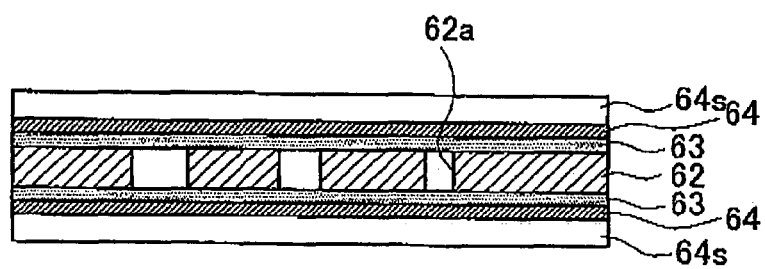
Figures 3, 22:
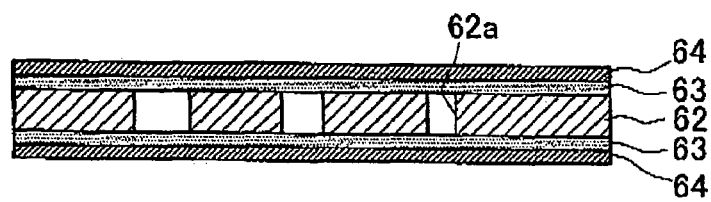
Figures 4, 22:
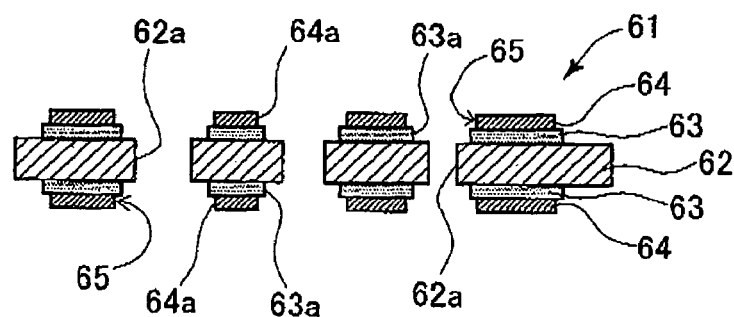

Furthermore, as shown in FIG. 22 (22-2), nickel green sheets before firing, which are formed with a size of 150 mm square and a thickness of not less than 0.3 μm and not more than 20 μm and serve as the first and second metal electrodes after firing, are respectively laminated on the first and second dielectric layers 63. The nickel green sheets are obtained by forming thin film of a nickel slurry on carrier sheets 64s of polyester or the like by the known doctor blade method, and by allowing the thin film to dry. The nickel green sheets are laminated on the surfaces of the barium titanate green sheets, and are subsequently press bonded under predetermined conditions, and the carrier sheets 64s are peeled off (see FIG. 22 (22-3). It should be noted that a ceramic powder of barium titanate or the like contained in the first and second dielectric layers 63 may be mixed into the slurry for forming the nickel green sheets by 50 vol. % or less. By mixing the same component as that of the first and second dielectric layers 63 into the first and second metal electrodes 64, adhesion can be further improved when the first and second dielectric layers 63 and the first and second metal electrodes 64 are fired simultaneously. If the ceramic powder is mixed in an amount greater than 50 vol. %, there is a possibility of a decline in conductivity due to increased resistance and a decline in flexibility after firing. Here, the first and second dielectric layers 63 and the first and second metal electrodes 64 can also be press bonded under predetermined conditions after they are laminated.

Next, as shown in FIG. 22 (22-4), through holes 63a and through holes 64a penetrating in the thicknesswise direction are bored into the first and second dielectric layers 63 and the first and second metal electrodes 64 from both sides at positions corresponding to the through holes 62a of the metal foil 62 by a laser or a similar method.

Subsequently, the laminate thus obtained is subjected to degreasing and firing under predetermined conditions, and is cut into, for example, 15-mm squares by an unillustrated cutter, thereby fabricating the via array capacitors 61 having the communicating holes 65 formed with a predetermined pattern.

Next, a wiring board 1000 incorporating a via array capacitor (see FIG. 23) incorporating the via array capacitor 61 can be manufactured. For instance, the wiring board 1000 incorporating a via array capacitor 61 can be formed by the following procedures.

First, the via array capacitor 61 is disposed on the resin insulating layer 35. Subsequently, the resin insulating layer 37 is further disposed on the via array capacitor 61, and an assembly thereof is pressurized while being heated. Subsequently, via holes which penetrate the resin insulating layers 35 and 37 are formed immediately above the conductor layer 42, and the via conductors 43 connected to the conductor layers in the via holes are formed to electrically connect the via array capacitor 61, thereby completing the wiring board 1000 incorporating a via array capacitor. The via conductors 43 in this case can be formed by using, for example, via paste or plating which is formed as the via conductors 43 after curing. Further, the resin insulating layer 37 is subsequently formed on the via array capacitor 61.

First, the via array capacitor 61 is mounted on the resin insulating layer 35. At this time, since the via array capacitor 61 is mounted in a state in which the resin insulating layer 35 has not been cured or is semi-cured, the via array capacitor 61 can be mounted as it is in pressure contact with the flat resin insulating layer 35. Part of the resin insulating layer 35 is relatively pushed up (flows) into the communicating holes 65, thereby fitting the lower sides of the communicating holes. It should be noted that it is alternatively possible to allow the resin insulating layer 35 to cure, apply an adhesive or the like to it separately, and mount the via array capacitor 61 thereon. Meanwhile, when the via array capacitor 61 is mounted on the resin insulating layer 35, the via array capacitor 61 is mounted while being pressed onto the resin insulating layer 35; however, since the via array capacitor 61 has high strength, there is no possibility of the occurrence of warpage, cracking, or the like. In addition, since the via array capacitor 61 is provided with the plurality of communicating holes 65 communicating in the thicknesswise direction, air or the like located between them is guided upwardly of the via array capacitor 61 through the communicating holes 65, so that the via array capacitor 61 can be mounted easily while preventing the entrainment of bubbles. Furthermore, since the communicating holes 65 are formed, the area of contact with the resin insulating layer 35 becomes large, so that adhesion improves, and drawbacks such as exfoliation can be prevented.

Subsequently, the resin insulating layer 37 is formed in such a manner as to cover the via array capacitor 61. Further, holes are bored in the resin insulating layers 35 and 37 at predetermined positions by the laser to form the via holes.

Next, the via holes thus formed are filled with Cu plating or the like to form via conductors 71 and 72 and form the conductor layer with a predetermined pattern. Specifically, electroless Cu plating is first performed with respect to the interiors of the via holes 71 and 72 and onto the resin insulating layer 37, and electrolytic Cu plating is subsequently provided. Then, an etching resist layer of a predetermined pattern is formed on the Cu plating layer, and as the Cu plating layer exposed from this etching resist layer is removed by etching, to thereby form the via conductors 71 and the conductor layer. Through this step, the conductor layers, the metal foil 62, and the first and second metal electrodes 64 are respectively electrically connected. In addition, the conductor layer on the resin insulating layer 37 maybe formed by a semi-additive process in which electroless Cu plating is provided, a plating resist layer of a predetermined pattern is formed, electrolytic Cu plating is carried out, and after the plating resist layer is peeled off, the electroless Cu plating at the portion where the plating resist layer was peeled off is subjected to etching.

Figure 23:
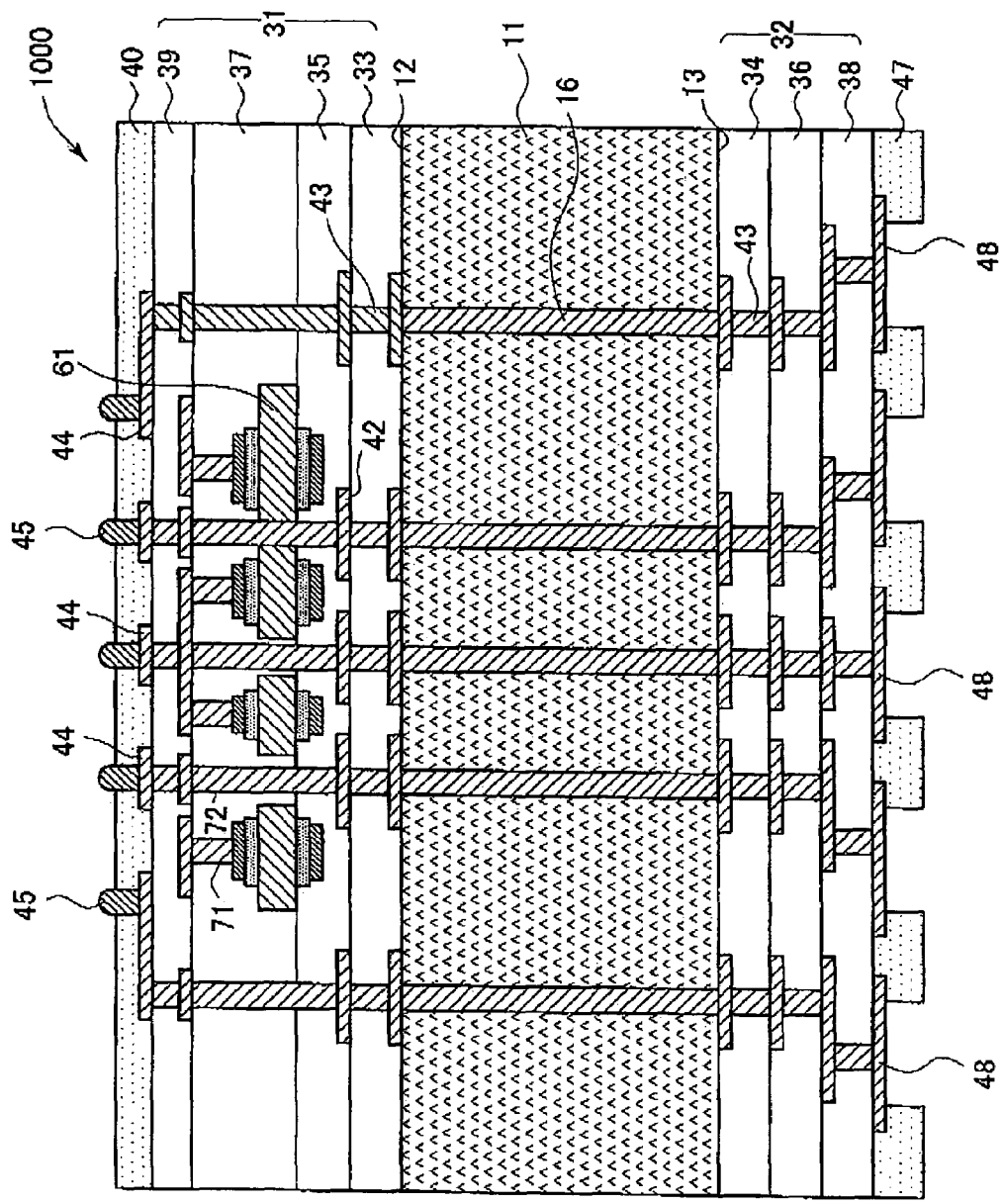
FIG. 23 is a schematic cross-sectional view of a wiring board incorporating a via array capacitor in accordance with the further embodiment.

Subsequently, the resin insulating layer 39 and the solder resist 40, i.e., a conductor layer, can be laminated by a known buildup process, and the wiring board 1000 can thus be manufactured (see FIG. 23).

This application is based on Japanese Patent application JP 2005-337969, filed Nov. 24, 2005, Japanese Patent application JP 2006-32984, filed Feb. 9, 2006, and Japanese Patent application JP 2006-281379, filed Oct. 16, 2006, the entire contents of which are hereby incorporated by reference, the same as if set forth at length.

What is claimed is:

1. A via array capacitor comprising:
   a capacitor body including a first main surface and a second main surface and having a structure in which dielectric layers and inner electrode layers are alternately laminated;
   a plurality of via conductors which conduct the inner electrode layers to each other and are, as a whole, arranged in array form; and
   metal-containing layers which are disposed on at least one of the first main surface and the second main surface,
   wherein a total volume of the inner electrode layers and the metal-containing layers included in the via array capacitor is from 45 vol. % to 95 vol. % of a volume of the via array capacitor.

2. The via array capacitor according to claim 1, wherein a ratio of a metal component of the inner electrode layers and the metal-containing layers is 50 vol. % or greater.

3. The via array capacitor according to claim 1, wherein the via array capacitor has a thickness of from 10 μm to 200 μm.

4. The via array capacitor according to claim 1, wherein when a jig having a pressing surface with a curved surface formed thereon is pressed against the via array capacitor, if it is assumed that a linear length in a planar direction of the via array capacitor is W, and that a bending distance in a thicknesswise direction thereof is d, the via array capacitor can be bent in the thicknesswise direction in a range in which d/W is 0.01 or greater.

5. The via array capacitor according to claim 1, wherein when a jig having a pressure surface with a curved surface formed thereon is pressed against the via array capacitor, the via array capacitor is resiliently deformable in a range in which a radius of curvature is 700 mm or less.

\* \* \* \* \*